United States Patent
Yu et al.

(10) Patent No.: US 12,340,747 B2
(45) Date of Patent: Jun. 24, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Ziyang Yu, Beijing (CN); Haigang Qing, Beijing (CN); Jingwen Zhang, Beijing (CN); Gukhwan Song, Beijing (CN); Zhiliang Jiang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/579,420

(22) PCT Filed: Feb. 28, 2023

(86) PCT No.: PCT/CN2023/078713
§ 371 (c)(1),
(2) Date: Jan. 15, 2024

(87) PCT Pub. No.: WO2024/178606
PCT Pub. Date: Sep. 6, 2024

(65) Prior Publication Data
US 2025/0046244 A1  Feb. 6, 2025

(51) Int. Cl.
*G09G 3/3233* (2016.01)
*G09G 3/20* (2006.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC ............ G09G 3/3233; G09G 2310/08; G09G 2360/14; G09G 3/2074; G09G 2300/0809;
(Continued)

(56) References Cited

U.S. PATENT DOCUMENTS 10,636,357 B1  4/2020  Brownlow et al.
12,127,431 B2 * 10/2024  Chang ................. H10K 59/131
(Continued)

FOREIGN PATENT DOCUMENTS

CN     102044213 A    5/2011
CN     103400552 A   11/2013
(Continued)

OTHER PUBLICATIONS

International Search Report & Written Opinion mailed Jun. 23, 2023, regarding PCT/CN2023/078713.

*Primary Examiner* — Douglas Wilson
(74) *Attorney, Agent, or Firm* — Intellectual Valley Law, P.C.

(57) ABSTRACT

An array substrate is provided. The array substrate includes a plurality of first subpixels in a first region and a plurality of second subpixels in a second region. The plurality of first subpixels include a plurality of first pixel driving circuits. The plurality of second subpixels include a plurality of second pixel driving circuits. A respective first pixel driving circuit of the plurality of first pixel driving circuits includes a smaller number of transistors than a respective second pixel driving circuit of the plurality of second pixel driving circuits. The first region has a light transmittance higher than the second region, and a subpixel density same as the second region.

19 Claims, 39 Drawing Sheets

(51) Int. Cl.
  *H04M 1/02* (2006.01)
  *H04N 23/57* (2023.01)
  *H10K 59/121* (2023.01)
  *H10K 59/122* (2023.01)
  *H10K 59/126* (2023.01)
  *H10K 59/131* (2023.01)
  *H10K 59/65* (2023.01)

(52) U.S. Cl.
  CPC ......... *H10K 59/122* (2023.02); *H10K 59/131* (2023.02); *H10K 59/65* (2023.02); *G09G 3/2074* (2013.01); *G09G 2300/0809* (2013.01); *G09G 2300/0819* (2013.01); *G09G 2310/08* (2013.01); *H04M 1/0264* (2013.01); *H04N 23/57* (2023.01); *H10K 59/121* (2023.02); *H10K 59/126* (2023.02)

(58) Field of Classification Search
  CPC ....... G09G 2300/0819; H10K 59/1213; H10K 59/1216; H10K 59/122; H10K 59/131; H10K 59/65; H10K 59/121; H10K 59/126; H04M 1/0264; H04N 23/57
  See application file for complete search history.

(56) References Cited

U.S. PATENT DOCUMENTS

| | | |
|---|---|---|
| 2014/0354182 A1 | 12/2014 | Liu et al. |
| 2016/0005356 A1 | 1/2016 | Zhang et al. |
| 2019/0074341 A1 | 3/2019 | Cai |
| 2021/0193755 A1* | 6/2021 | Kim .................. H10K 59/1216 |
| 2021/0358390 A1 | 11/2021 | Yue et al. |
| 2022/0320456 A1 | 10/2022 | Lius et al. |
| 2024/0063229 A1* | 2/2024 | Kim .................. H10D 30/6731 |
| 2024/0074268 A1* | 2/2024 | Huang .................. H10K 59/35 |
| 2024/0172502 A1* | 5/2024 | Li .......................... H10D 86/00 |
| 2024/0431157 A1* | 12/2024 | Lv ............................ G09G 3/32 |

FOREIGN PATENT DOCUMENTS

| | | |
|---|---|---|
| CN | 103531151 A | 1/2014 |
| CN | 104751771 A | 7/2015 |
| CN | 107492344 A | 12/2017 |
| CN | 107993612 A | 5/2018 |
| CN | 108470537 A | 8/2018 |
| CN | 108630147 A | 10/2018 |
| CN | 110189706 A | 8/2019 |
| CN | 114420004 A | 4/2022 |
| WO | 2022227265 A1 | 11/2022 |
| WO | 2023279333 A1 | 1/2023 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/078713, filed Feb. 28, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of first subpixels in a first region and a plurality of second subpixels in a second region; wherein the plurality of first subpixels comprise a plurality of first pixel driving circuits, the plurality of second subpixels comprise a plurality of second pixel driving circuits; a respective first pixel driving circuit of the plurality of first pixel driving circuits comprises a smaller number of transistors than a respective second pixel driving circuit of the plurality of second pixel driving circuits; and the first region has a light transmittance higher than the second region, and a subpixel density same as the second region.

Optionally, the array substrate further comprises a plurality of photodiodes in the first region configured to capture an image, and a camera circuit coupled to the plurality of photodiodes.

Optionally, the array substrate comprises multiple signal lines in different layers extending at least partially through the first region along a first direction; wherein orthographic projections of the multiple signal lines on a base substrate at least partially overlap with each other continuously over a length of at least two first subpixels along the first direction.

Optionally, the multiple signal lines have conforming shapes and substantially parallel extension directions where the orthographic projections of the multiple signal lines overlap with each other continuously over the length of at least two first subpixels; and at least one of the multiple signal lines extends, in a same layer, from the second region into the first region, and is configured to provide signals to multiple first subpixels in the first region and multiple second subpixel in the second region.

Optionally, the multiple signal lines comprise at least two of a light shielding block connecting line connecting a plurality of light shielding blocks in a light shielding layer; a light emitting control signal line in a first conductive layer configured to provide a control signal to a gate electrode of an emission control transistor in the respective first pixel driving circuit; a gate line in a third conductive layer configured to provide a control signal to a gate electrode of a data-write transistor in the respective first pixel driving circuit; and a power supply transmission line in a first signal line layer configured to provide a voltage to a second capacitor electrode of a storage capacitor in the respective first pixel driving circuit; wherein orthographic projections of at least two of a portion of the light shielding block connecting line in the first region, a portion of the light emitting control signal line in the first region, a portion of the gate line in the first region, and a portion of the power supply transmission line in the first region on a base substrate at least partially overlap with each other.

Optionally, the light shielding block connecting line is configured to transmit a same signal as the power supply transmission line.

Optionally, a portion of the light shielding block connecting line in the first region is a zig-zag line portion; a portion of the light emitting control signal line in the first region is a zig-zag line portion; a portion of the gate line in the first region is a zig-zag line portion; and a portion of the power supply transmission line in the first region is a zig-zag line portion.

Optionally, in the first region, along a first direction, an orthographic projection of an active layer of a reset transistor on a base substrate and an orthographic projection of an active layer of a data write transistor on the base substrate are on two opposite sides of an orthographic projection of an active layer of a driving transistor on the base substrate; and the active layer of the driving transistor is in a layer different from the active layer of the reset transistor and the active layer of the data write transistor.

Optionally, the plurality of first subpixels comprise a plurality of first light emitting elements; the plurality of second subpixels comprise a plurality of second light emitting elements; and for a first subpixel in the first region and a second subpixel in the second region configured to emit light of a same color, a first anode of a first light emitting element in the first subpixel has an area smaller than a second anode of a second light emitting element in the second subpixel.

Optionally, the array substrate further comprises a pixel definition layer defining a plurality of first subpixel apertures in the first region and a plurality of second subpixel apertures in the second region; wherein, for a first subpixel in the first region and a second subpixel in the second region configured to emit light of a same color, a first subpixel aperture of the first subpixel has an area smaller than a second subpixel aperture of the second subpixel.

Optionally, the plurality of first subpixels comprise a plurality of first light emitting elements; electrodes of transistors and capacitor of the respective first pixel driving circuit are clustered in a same region as a respective anode of a respective first light emitting element of the plurality of first light emitting elements; and the same region has an area no more than 50% of an area of a respective first subpixel of the plurality of first subpixels.

Optionally, the array substrate further comprises a reset signal plate configured to provide a reset signal to the plurality of first pixel driving circuits.

Optionally, the reset signal plate is a unitary plate.

Optionally, the array substrate further comprises a plurality of anode connecting pads in the first region and a plurality of apertures extending through the reset signal plate; wherein the plurality of anode connecting pads are in the plurality of apertures, respectively; wherein the plurality of first subpixels comprise a plurality of first light emitting elements; and the plurality of anode connecting pads are coupled to a plurality of anodes of the plurality of first light emitting elements, respectively.

Optionally, the array substrate further comprises a plurality of data lines extending continuously through the first region and the second region; a respective data line extending continuously through the first region and the second region has different shapes in the first region and the second region; and in the first region, the respective data line is a zig-zag line.

Optionally, the respective data line extends along a second direction; at least a portion of the respective data line and a portion of a signal line extending along a first direction have conforming shapes and substantially parallel extension directions; and orthographic projections of the portion of the respective data line and the portion of the signal line on a base substrate at least partially overlap with each other.

Optionally, the array substrate further comprises a plurality of data lines extending continuously through the first region and the second region; wherein a respective data line extending continuously through the first region and the second region has different shapes in the first region and the second region; and an orthographic projection of the respective data line on a base substrate at least partially overlap with an orthographic projection of active layers of driving transistors in a column of pixel driving circuits on the base substrate.

Optionally, the at least one signal line is selected from the group consisting of a power supply voltage line configured to provide a voltage to a second capacitor electrode of a storage capacitor in the respective second pixel driving circuit; and a gate line configured to provide a control signal to a gate electrode of a data-write transistor in the respective second pixel driving circuit.

Optionally, at least one of the multiple signal lines is configured to provide signals to multiple first subpixels in the first region but not to the plurality of second subpixels in the second region; and at least one of the multiple signal lines in the first region is connected to a signal line in a different layer in the second region.

In another aspect, the present disclosure provides a display apparatus, comprising the array substrate described herein or fabricated by a method described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of first subpixels in a first region and a plurality of second subpixels in a second region. Optionally, the plurality of first subpixels include a plurality of first pixel driving circuits, the plurality of second subpixels include a plurality of second pixel driving circuits. Optionally, a respective first pixel driving circuit of the plurality of first pixel driving circuits includes a smaller number of transistors than a respective second pixel driving circuit of the plurality of second pixel driving circuits. Optionally, the first region has a light transmittance higher than the second region, and a subpixel density same as the second region.

Figure 1:
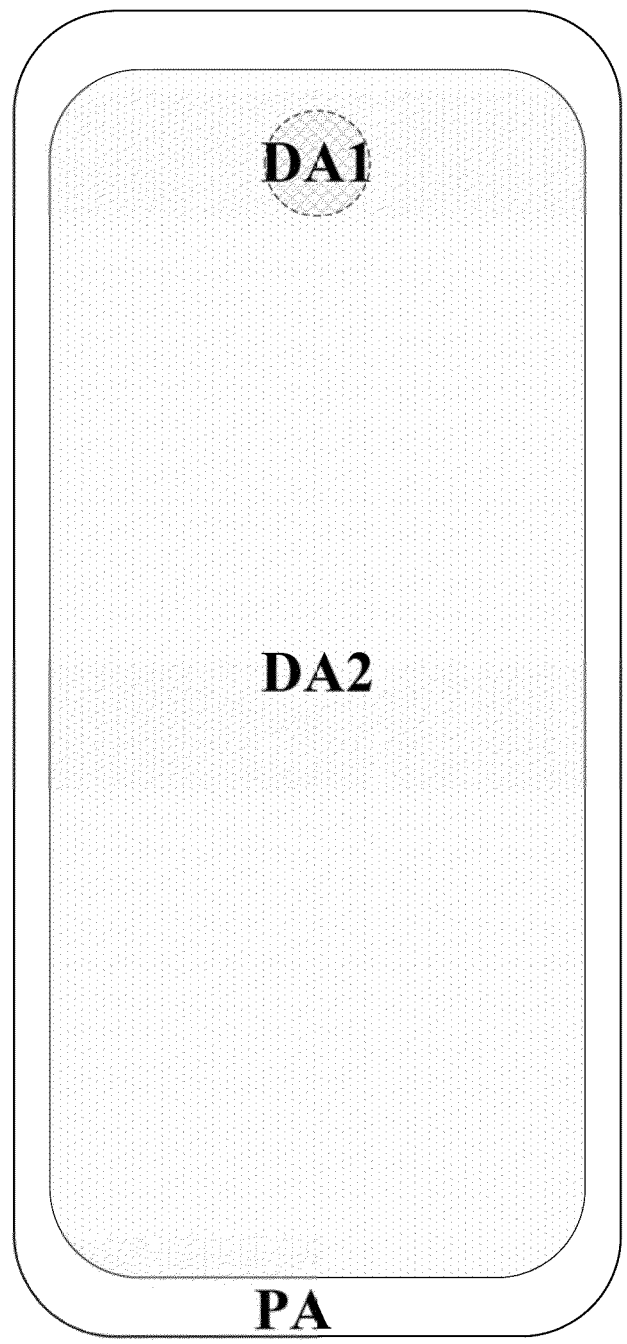
FIG. 1 is a schematic diagram illustrating the structure of an array substrate in some embodiments according to the present disclosure.

FIG. 1 is a schematic diagram illustrating the structure of an array substrate in some embodiments according to the present disclosure. Referring to FIG. 1, the array substrate in some embodiments includes a display region and a peripheral region PA. As used herein, the term "display region" refers to an area of an array substrate in a display panel where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. As used herein the term "peripheral region" refers to an area of an array substrate in a display panel where various circuits and wires are provided to transmit signals to the display substrate. To increase the transparency of the display apparatus, non-transparent or opaque components of the array apparatus (e.g., battery, printed circuit board, metal frame), can be disposed in the peripheral region rather than in the display region.

In some embodiments, the display region includes a first region DA1 and a second region DA2. Optionally, the first region DA1 and the second region DA2 are non-overlapping with each other. Optionally, the first region DA1 and the second region DA2 are continuous display regions so that an image may be displayed throughout the first region DA1 and the second region DA2 without interruption. An integral image may be displayed in the array substrate.

Figure 2:
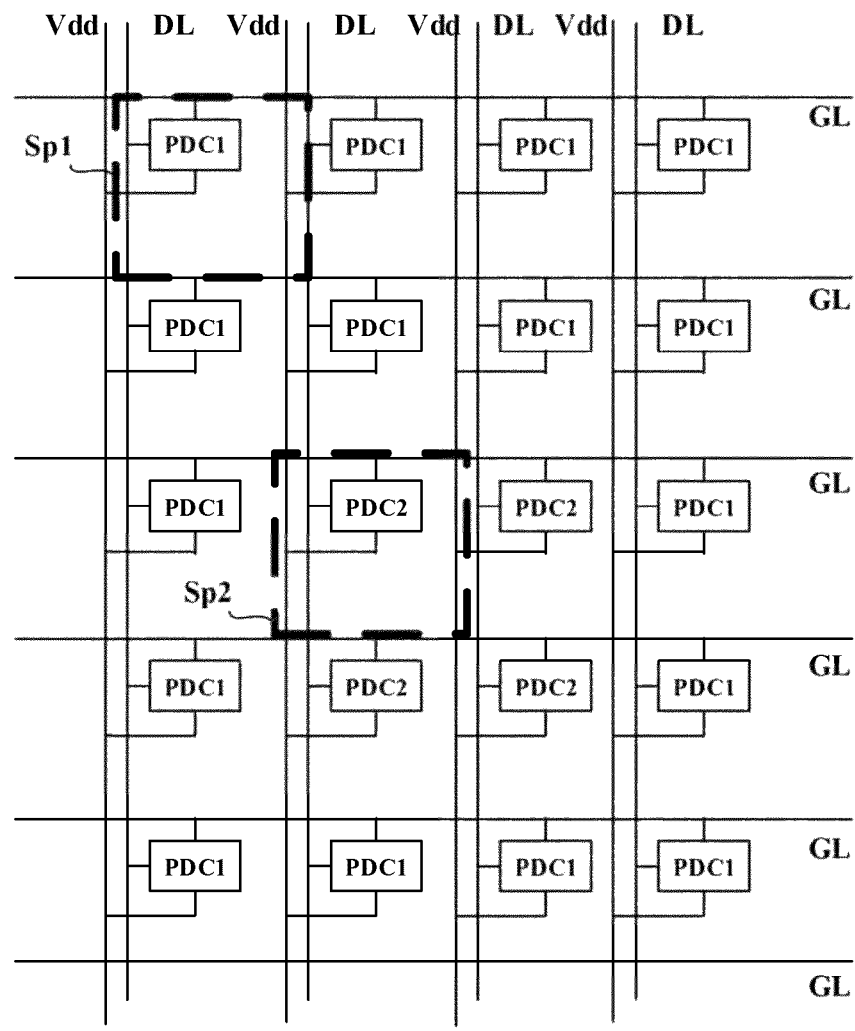
FIG. 2 is a circuit diagram of an array substrate in some embodiments according to the present disclosure.

FIG. 2 is a circuit diagram of an array substrate in some embodiments according to the present disclosure. Referring to FIG. 2, the array substrate includes an array of subpixels. Each subpixel includes an electronic component, e.g. a light emitting element. In one example, the light emitting element is driven by a respective pixel driving circuit. The array substrate includes a plurality of gate lines GL, a plurality of data lines DL, and a plurality of power supply voltage lines Vdd. Light emission in a respective subpixel is driven by a respective pixel driving circuit. In one example, a high voltage signal is input, through a respective one of the plurality of power supply voltage lines Vdd, to the respective pixel driving circuit connected to an anode of the light emitting element; a low voltage signal is input to a cathode of the light emitting element. A voltage difference between the high voltage signal (e.g., the VDD signal) and the low voltage signal (e.g., the VSS signal) is a driving voltage $\Delta V$ that drives light emission in the light emitting element.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, the array substrate includes a plurality of first subpixels Sp1 in a first region DA1 and a plurality of second subpixels Sp2 in a second region DA2. The plurality of first subpixels Sp1 include a plurality of first pixel driving circuits PDC1, the plurality of second subpixels Sp2 include a plurality of second pixel driving circuits PDC2. Optionally, the plurality of first subpixels Sp1 and the plurality of second subpixels Sp2 form an array comprising rows and columns, the array being continuous throughout the first region to the second region, uninterrupted. Optionally, the plurality of first pixel driving circuits PDC1 and the plurality of second pixel driving circuits PDC2 form an array comprising rows and columns, the array being continuous throughout the first region to the second region, uninterrupted.

In some embodiments, the array substrate further includes a plurality of light emitting elements driven by the plurality of pixel driving circuits. The plurality of first subpixels comprise a plurality of first light emitting elements, the plurality of second subpixels comprise a plurality of second light emitting elements. The plurality of first pixel driving circuits PDC1 are configured to drive light emission in the plurality of first light emitting elements, the plurality of second pixel driving circuits PDC2 are configured to drive light emission in the plurality of second light emitting elements. Optionally, the plurality of first light emitting elements and the plurality of second light emitting elements form an array comprising rows and columns, the array being continuous throughout the first region to the second region, uninterrupted.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

In some embodiments, a respective first pixel driving circuit of the plurality of first pixel driving circuits PDC1 includes a smaller number of transistors than a respective second pixel driving circuit of the plurality of second pixel driving circuits PDC2. In one example, the plurality of first pixel driving circuits PDC1 are pixel driving circuits having a simpler structure as compared to the plurality of second pixel driving circuits PDC2. In another example, the plurality of first pixel driving circuits PDC1 are 7T1C pixel driving circuits, and the plurality of second pixel driving circuits PDC2 are 4T1C pixel driving circuits.

Figure 3A:
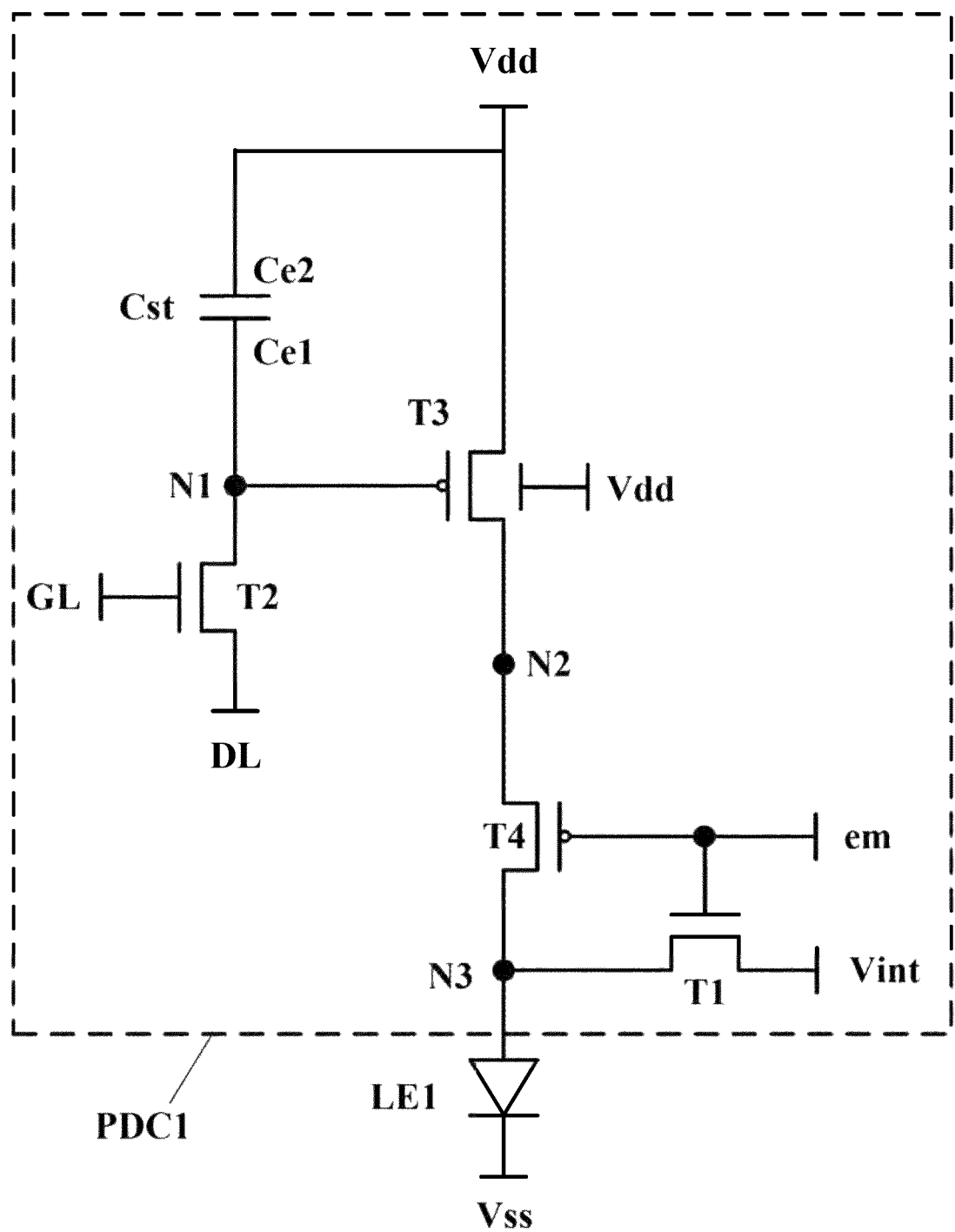
FIG. 3A is a circuit diagram illustrating the structure of a respective first pixel driving circuit and a respective first light emitting element in some embodiments according to the present disclosure.

FIG. 3A is a circuit diagram illustrating the structure of a respective first pixel driving circuit and a respective first light emitting element in some embodiments according to the present disclosure. Referring to FIG. 3A, in some embodiments, the respective first pixel driving circuit includes a storage capacitor Cst having a first capacitor electrode Ce1 and a second capacitor electrode Ce2; a third transistor T3 (driving transistor) having a gate electrode coupled to the first capacitor electrode Ce1, a source electrode coupled to a respective power supply voltage line of the plurality of power supply voltage lines Vdd; a second transistor T2 (data write transistor) having a gate electrode coupled to a respective gate line of a plurality of gate lines GL, a source electrode coupled to a respective data line of a plurality of data lines DL, and a drain electrode coupled to a gate electrode of the third transistor T3; a fourth transistor T4 (emission control transistor) having a gate electrode connected to a respective light emitting control signal line of a plurality of light emitting control signal lines em, a source electrode coupled to a drain electrode of the third transistor T3, and a drain electrode coupled to an anode of a respective first light emitting element of a plurality of first light emitting elements LE1; and a first transistor T1 (reset transistor) having a gate electrode connected to the respective light emitting control signal line of a plurality of light emitting control signal lines em, a source electrode connected to the respective reset signal line of the plurality of reset signal lines Vint, and a drain electrode connected to the drain electrode of the fourth transistor T4 and the anode of the respective first light emitting element.

Optionally, the third transistor T3 and the fourth transistor T4 are p-type transistors, and the first transistor T1 and the second transistor T2 are n-type transistors. Optionally, the third transistor T3 has a double gate structure, with an additional gate electrode configured to be provided with a voltage of the plurality of power supply voltage lines Vdd.

The respective first pixel driving circuit further include a first node N1, a second node N2, and a third node N3. The first node N1 is coupled to the gate electrode of the third transistor T3, the first capacitor electrode Ce1, and the drain electrode of the second transistor T2. The second node N2 is coupled to the drain electrode of the third transistor T3 and the source electrode of the fourth transistor T4. The third node N3 is coupled to the drain electrode of the fourth transistor T4, the drain electrode of the first transistor T1, and the anode of the respective first light emitting element.

Figure 3B:
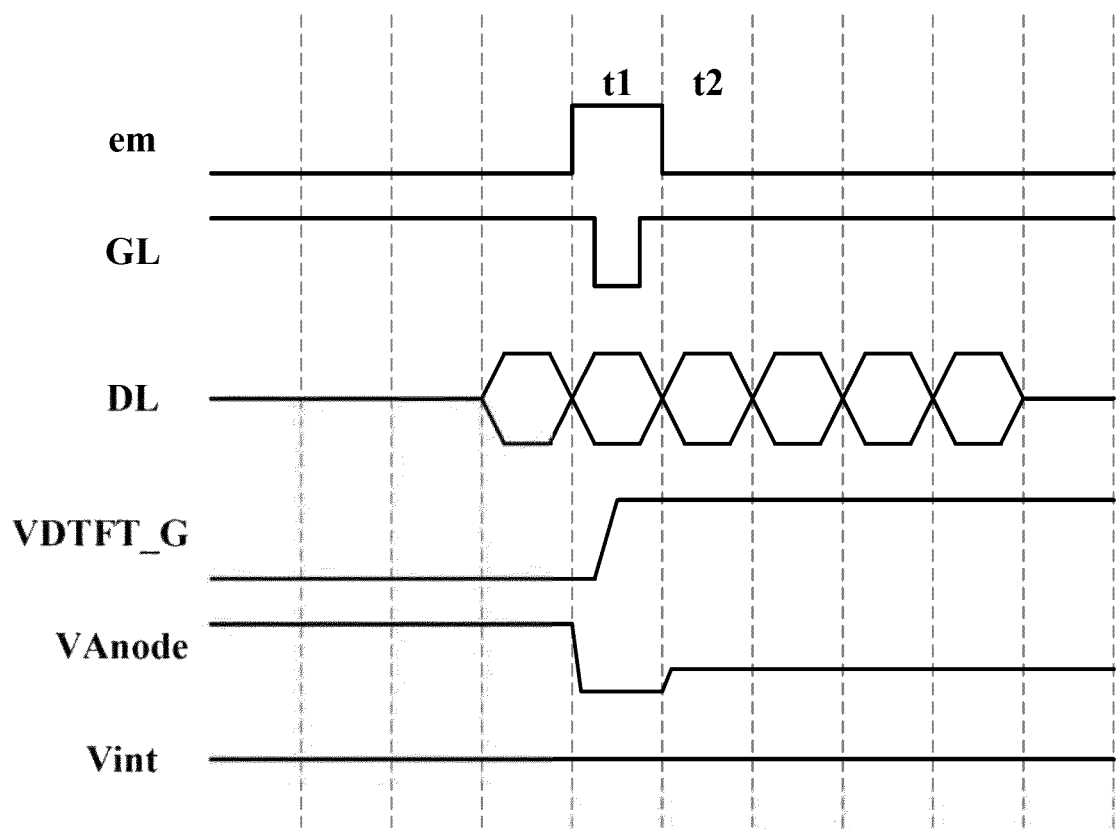
FIG. 3B is a timing diagram of operating an array substrate in a first region in an image display phase in some embodiments according to the present disclosure.

FIG. 3B is a timing diagram of operating an array substrate in a first region in an image display phase in some embodiments according to the present disclosure. Referring to FIG. 3A and FIG. 3B, the image display phase with respect to the respective first pixel driving circuit in some embodiments includes a first sub-phase t1 and a second sub-phase t2. In the first sub-phase t1, the respective light emitting control signal line of a plurality of light emitting control signal lines em is configured to provide a control signal to the gate electrode of the fourth transistor T4 to turn off the fourth transistor T4, and to the gate electrode of the first transistor T1 to turn on the first transistor T1 (T1 being an n-type transistor and T4 being a p-type transistor). The anode of the respective first light emitting element is reset to a voltage of the respective reset signal line of the plurality of reset signal lines Vint. The respective gate line of a plurality of gate lines GL is configured to provide a control signal to the gate electrode of the second transistor T2 to turn on the second transistor T2. A data signal is written into the first node N1. In the second sub-phase t2, the respective gate line of a plurality of gate lines GL is configured to provide a control signal to the gate electrode of the second transistor T2 to turn off the second transistor T2. The voltage level at the first node N1 maintain substantially unchanged (data signal). The respective light emitting control signal line of a plurality of light emitting control signal lines em is configured to provide a control signal to the gate electrode of the first transistor T1 to turn off the first transistor T1, and to the gate electrode of the fourth transistor T4 to turn on the fourth transistor T4. The driving current is allowed to flow to the anode of the respective first light emitting element, driving the respective first light emitting element to emit light.

Figure 4:
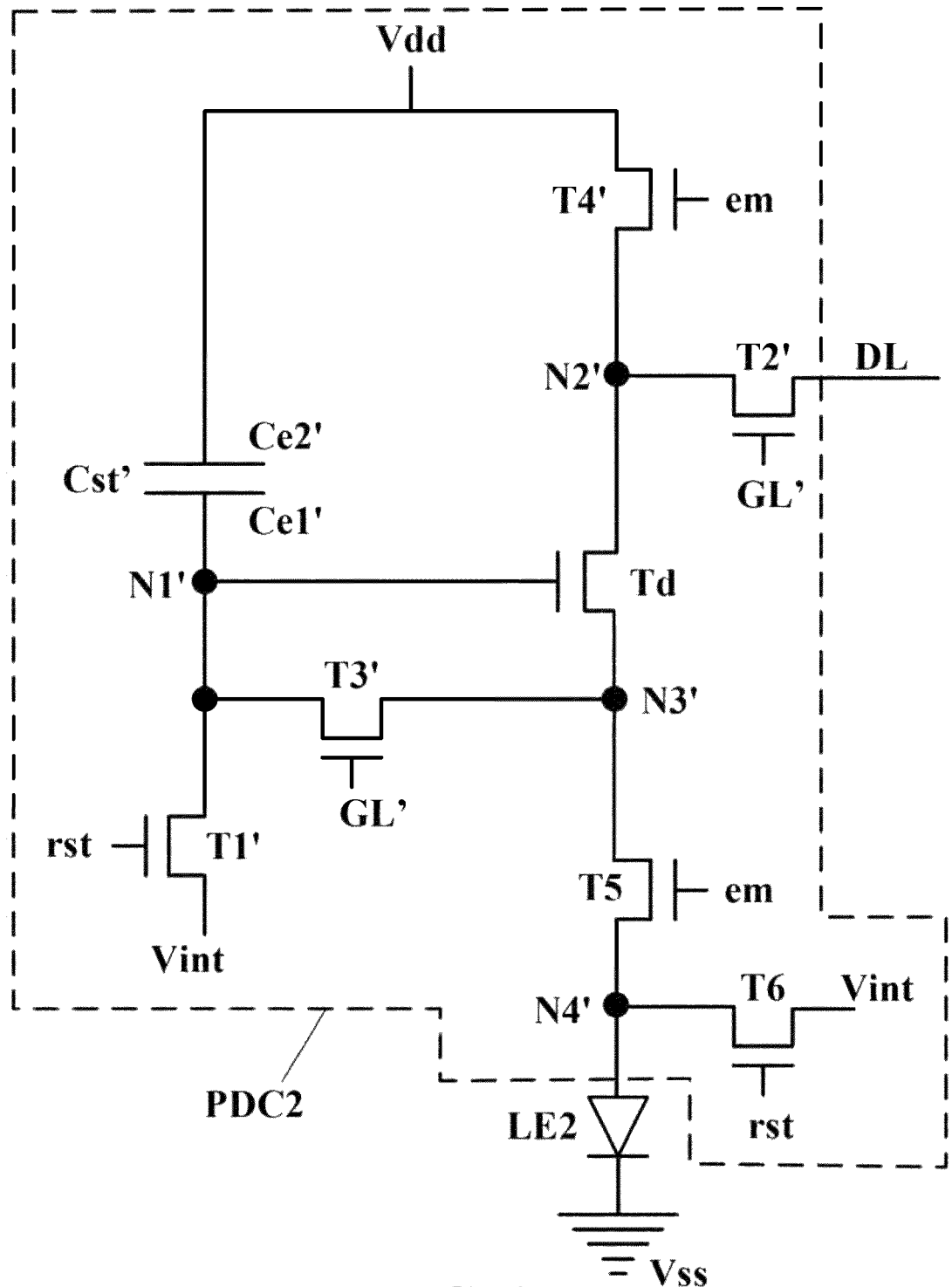
FIG. 4 is a circuit diagram illustrating the structure of a respective second pixel driving circuit and a respective second light emitting element in some embodiments according to the present disclosure.

FIG. 4 is a circuit diagram illustrating the structure of a respective second pixel driving circuit and a respective second light emitting element in some embodiments according to the present disclosure. Referring to FIG. 4, in some embodiments, the respective second pixel driving circuit PDC2 includes a driving transistor Td; a storage capacitor Cst' having a first capacitor electrode Ce1' and a second capacitor electrode Ce2'; a first transistor T1' having a gate electrode connected to a respective reset control signal line of a plurality of reset control signal lines rst, a source electrode connected to a respective reset signal line of a plurality of reset signal lines Vint, and a drain electrode connected to a first capacitor electrode Ce1' of the storage capacitor Cst' and a gate electrode of the driving transistor Td: a second transistor T2' having a gate electrode connected to a respective gate line of a plurality of gate lines GL', a source electrode connected to a respective data line of a plurality of data lines DL, and a drain electrode connected to a source electrode of the driving transistor Td; a third transistor T3' having a gate electrode connected to the respective gate line, a drain electrode connected to the first capacitor electrode Ce1' of the storage capacitor Cst' and the gate electrode of the driving transistor Td, and a source electrode connected to a drain electrode of the driving transistor Td; a fourth transistor T4' having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2'; a fifth transistor T5 having a gate electrode connected to the respective light emitting control signal line, a source electrode connected to the drain electrodes of the driving transistor Td and the source electrode of the third transistor T3', and a drain electrode connected to an anode of a respective second light emitting element of a plurality of second light emitting elements LE2; and a sixth transistor T6 having a gate electrode connected to the respective reset control signal line of the plurality of reset control signal lines rst, a source electrode connected to the respective reset signal line of the plurality of reset signal lines Vint, and a drain electrode connected to the drain electrode of the fifth transistor T5 and the anode of the respective second light emitting element. The second capacitor electrode Ce2' is connected to the respective voltage supply line and the source electrode of the fourth transistor T4'.

Figure 5:
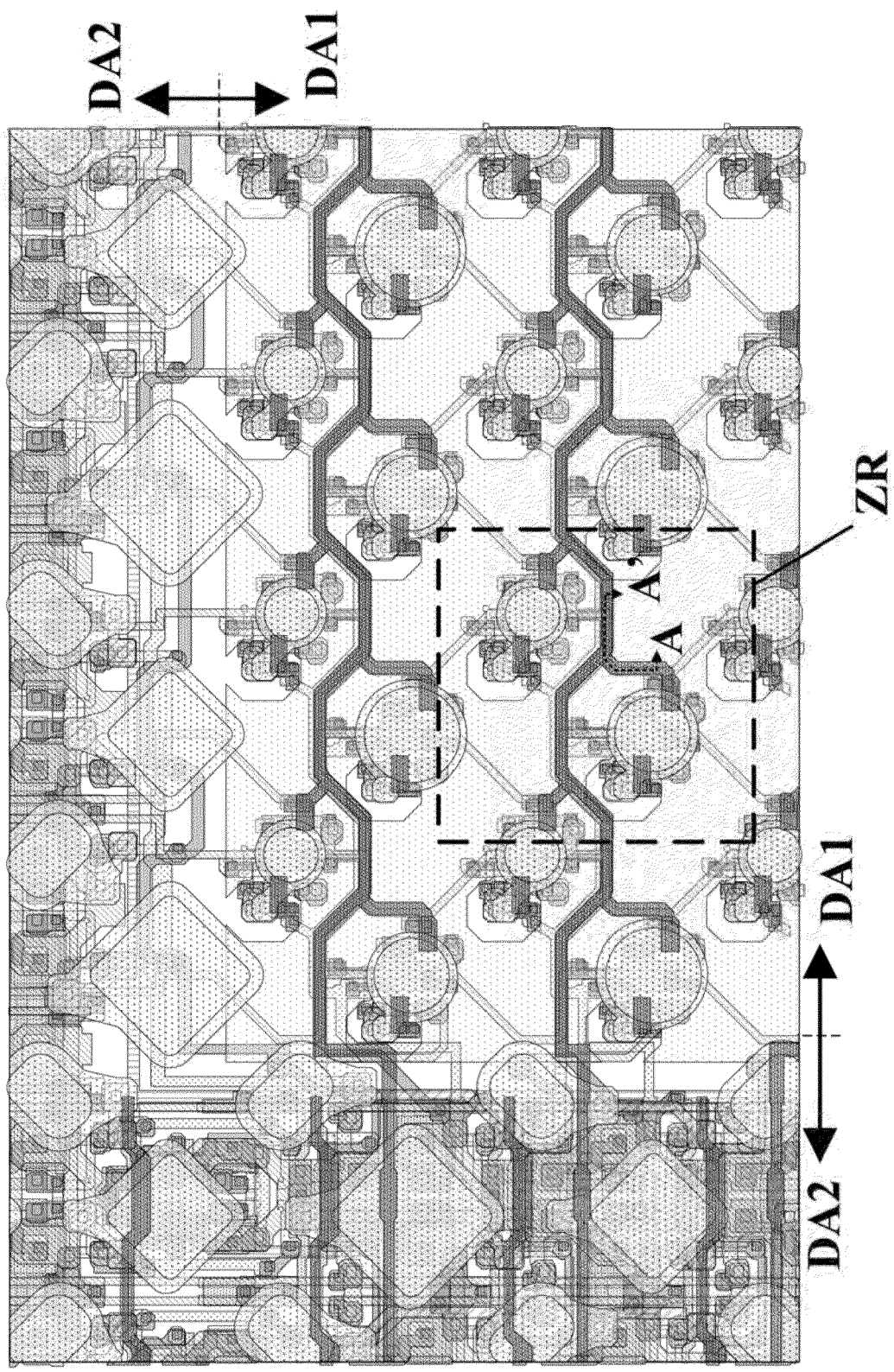
FIG. 5 illustrates the structure of an array substrate in some embodiments according to the present disclosure.

FIG. 5 illustrates the structure of an array substrate in some embodiments according to the present disclosure. The first region DA1 and the second region DA2 are annotated in FIG. 5. As shown in FIG. 5, in some embodiments, although the first region DA1 and the second region DA2 have a same subpixel density, the first region DA1 has a light transmittance higher than the second region DA2, due to the intricate structure in the first region DA according to the present disclosure. By having the intricated structure of the plurality of first pixel driving circuits and the plurality of first light emitting elements in the first region, the light transmittance can be significantly improved as compared to the second region by at least 20%, for example, by at least 25%, by at least 30%, by at least 35%, by at least 40%, by at least 45%, by at least 50%, by at least 55%, by at least 60%, by at least 65%, by at least 70%, by at least 75%, by at least 80%.

The areas occupied by non-transparent components of the array substrate in the first region DA1 are significantly reduced as compared to the areas occupied by non-transparent components of the array substrate in the second region DA2, for example, by at least 20%, by at least 25%, by at least 30%, by at least 35%, by at least 40%, by at least 45%, by at least 50%, by at least 55%, by at least 60%, by at least 65%, by at least 70%, by at least 75%, by at least 80%.

By having a higher light transmittance in the first region DA1 than the second region DA2, the first region DA1 may be multi-purposed for additional functions. For example, the first region DA1 may be used for installing a camera. In another example, the first region DA1 may be used as a region for transparent image display.

In some embodiments, the array substrate further includes a plurality of photodiodes in the first region DA1 configured to capture an image, and a camera circuit coupled to the plurality of photodiodes. Optionally, the plurality of photodiodes are disposed in the first region DA1 where non-transparent components are substantially absent.

Figure 6:
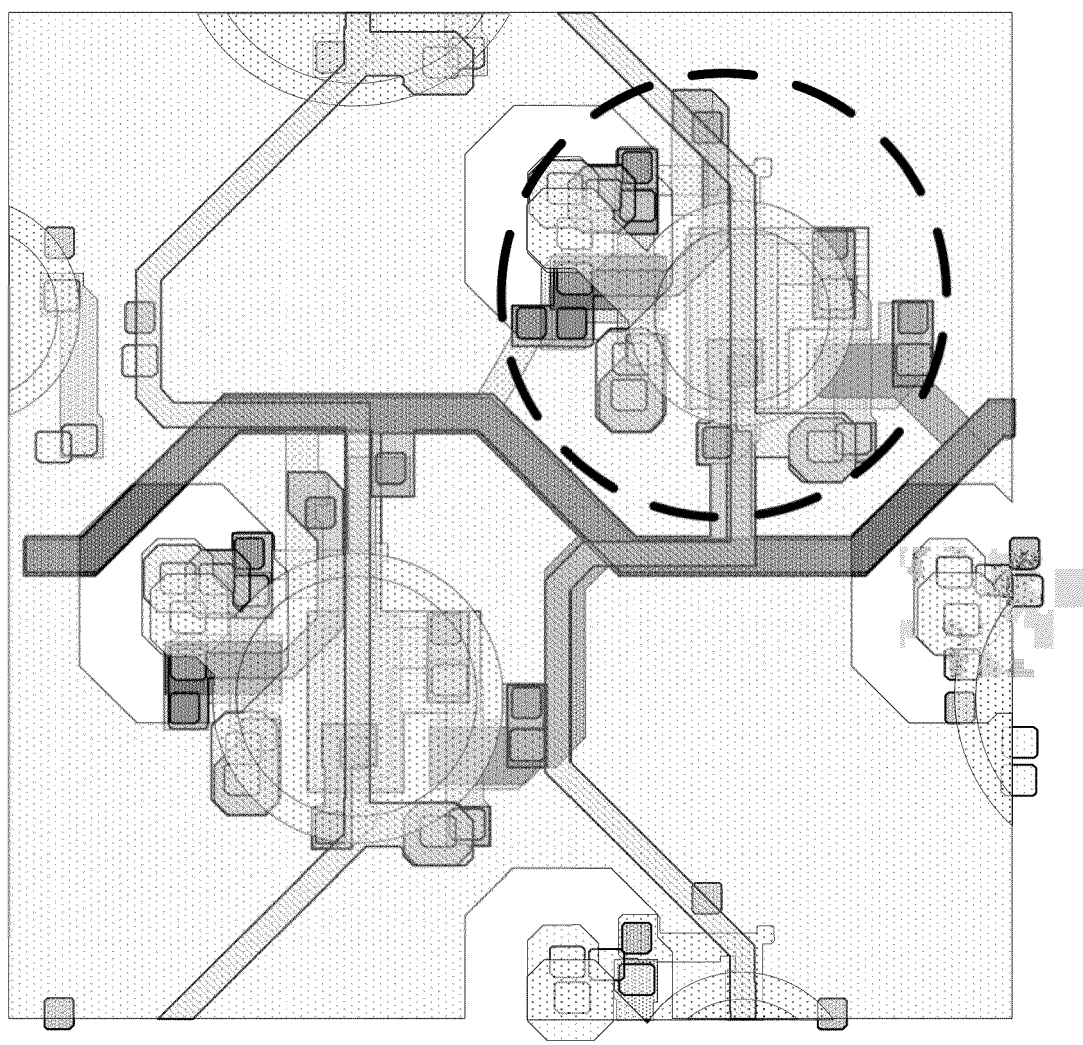
FIG. 6 is a zoom-in view of a zoom-in region ZR in FIG. 5.
Figure 7:
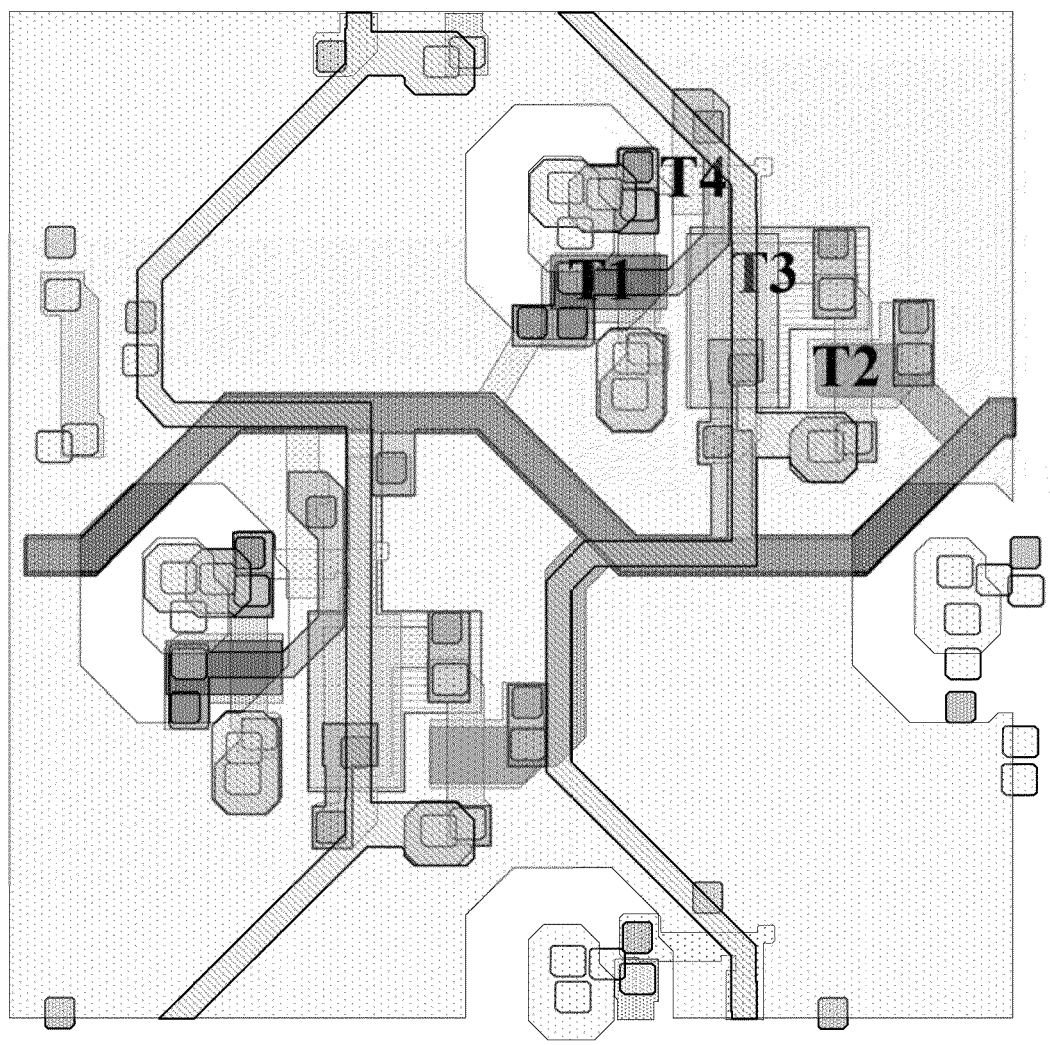
FIG. 7 illustrates the structure of the layers of a zoom-in region ZR in FIG. 5 other than an anode layer and a pixel definition layer.

FIG. 6 is a zoom-in view of a zoom-in region ZR in FIG. 5. FIG. 7 illustrates the structure of the layers of a zoom-in region ZR in FIG. 5 other than an anode layer and a pixel definition layer. Referring to FIG. 5 to FIG. 7, positions of the first transistor T1, the second transistor T2, the third transistor T3, and the fourth transistor T4 are denoted.

Figure 8A:
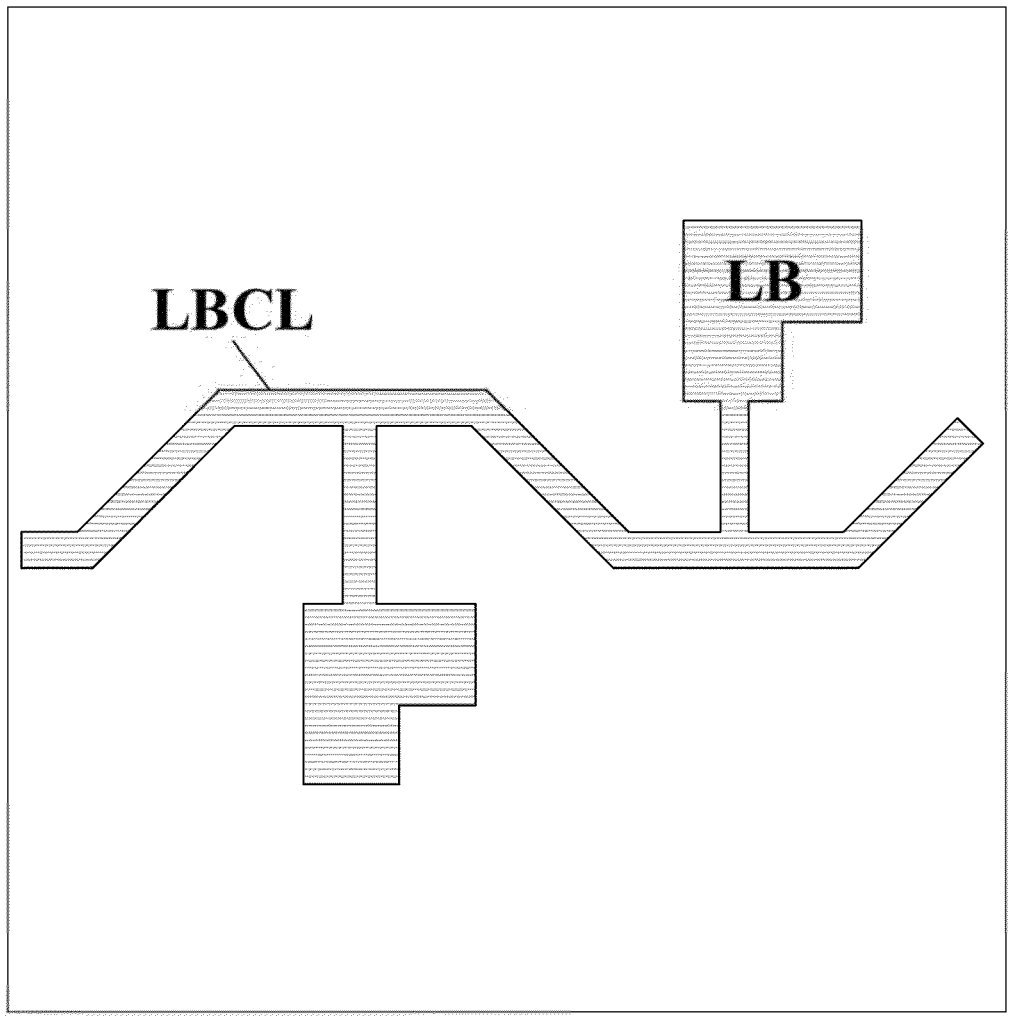
FIG. 8A illustrates the structure of a light shielding layer in a zoom-in region ZR in FIG. 8.
Figure 8B:
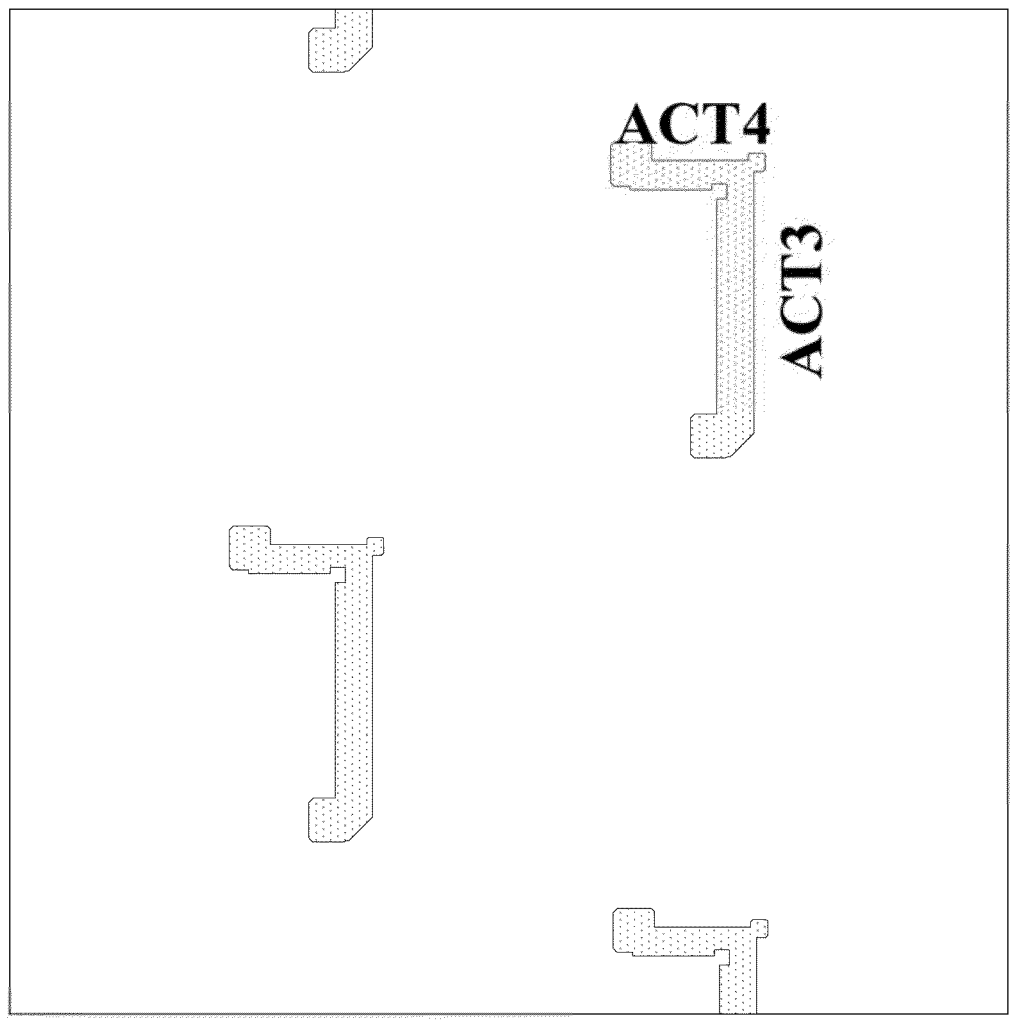
FIG. 8B illustrates the structure of a first semiconductor material layer in a zoom-in region ZR in FIG. 5.
Figure 8C:
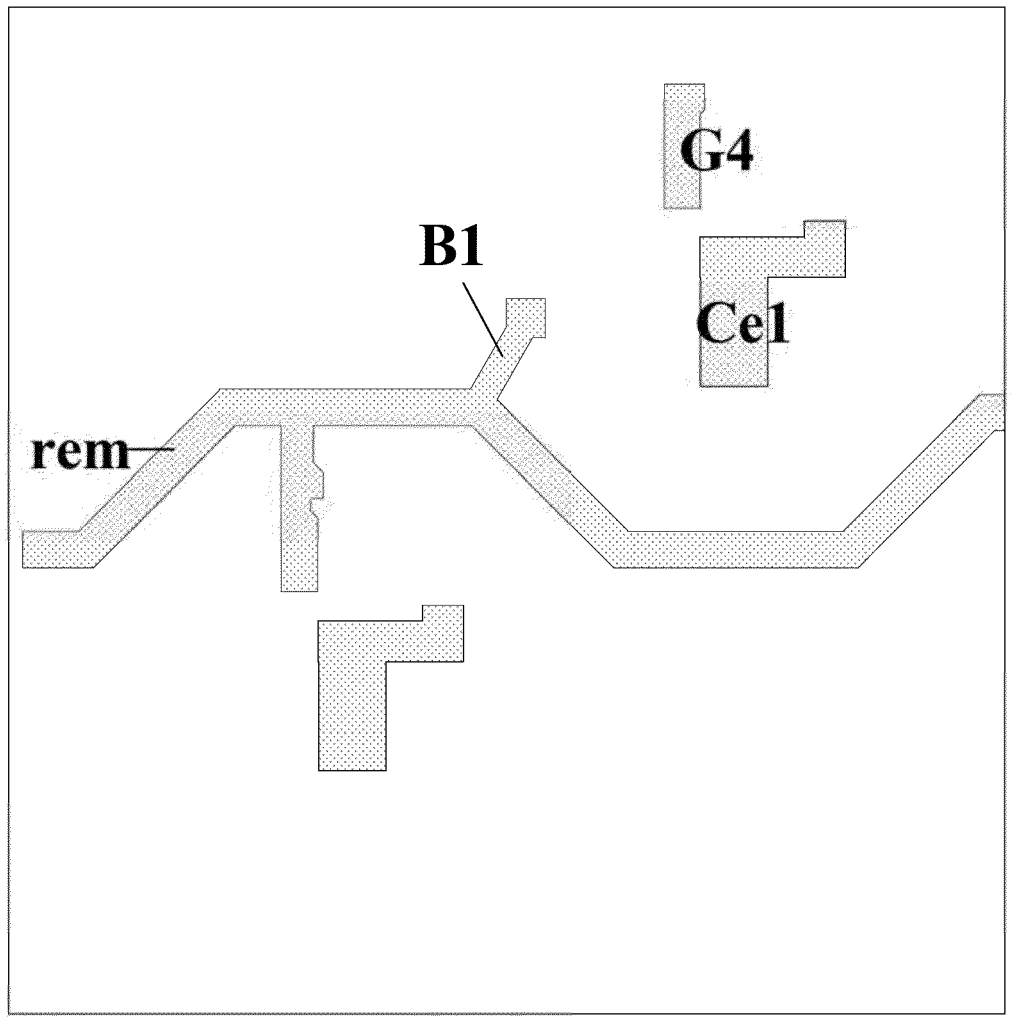
FIG. 8C illustrates the structure of a first conductive layer in a zoom-in region ZR in FIG. 5.
Figure 8D:
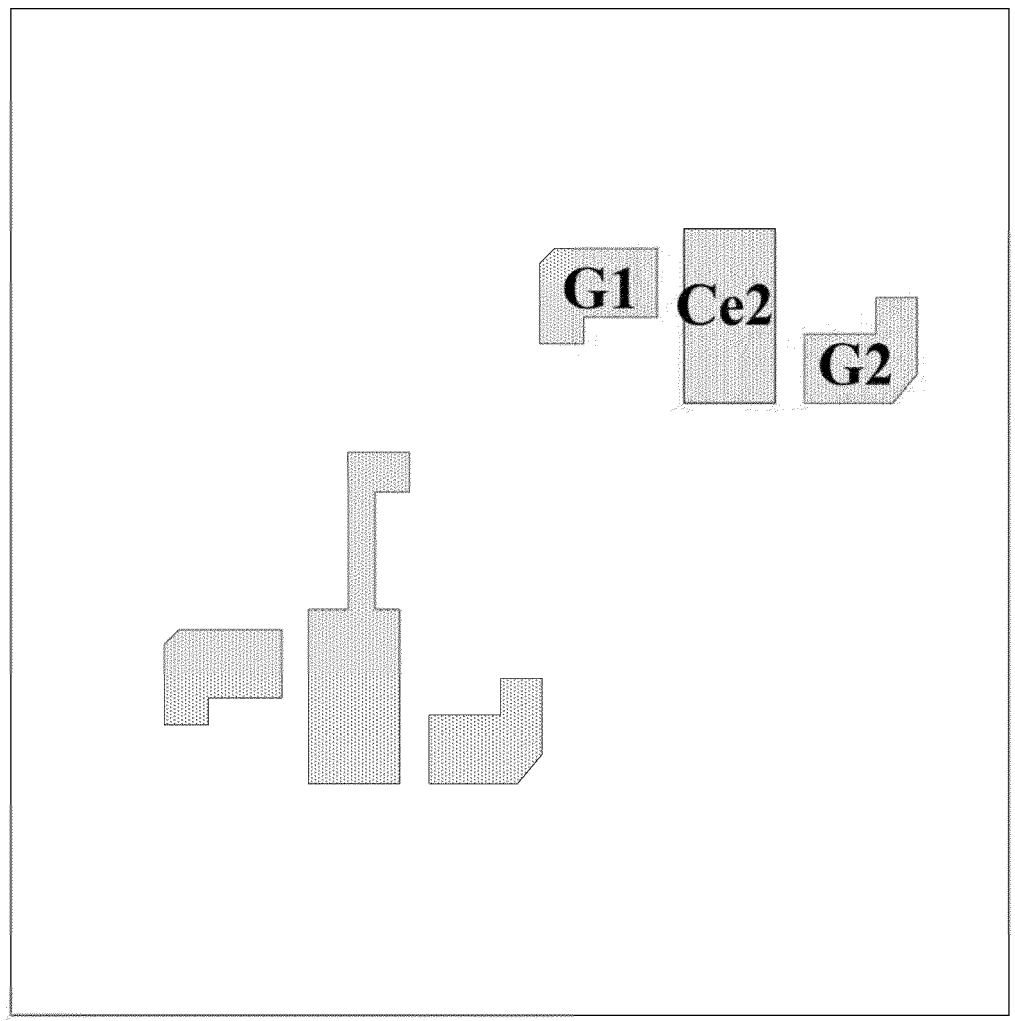
FIG. 8D illustrates the structure of a second conductive layer in a zoom-in region ZR in FIG. 5.
Figure 8E:
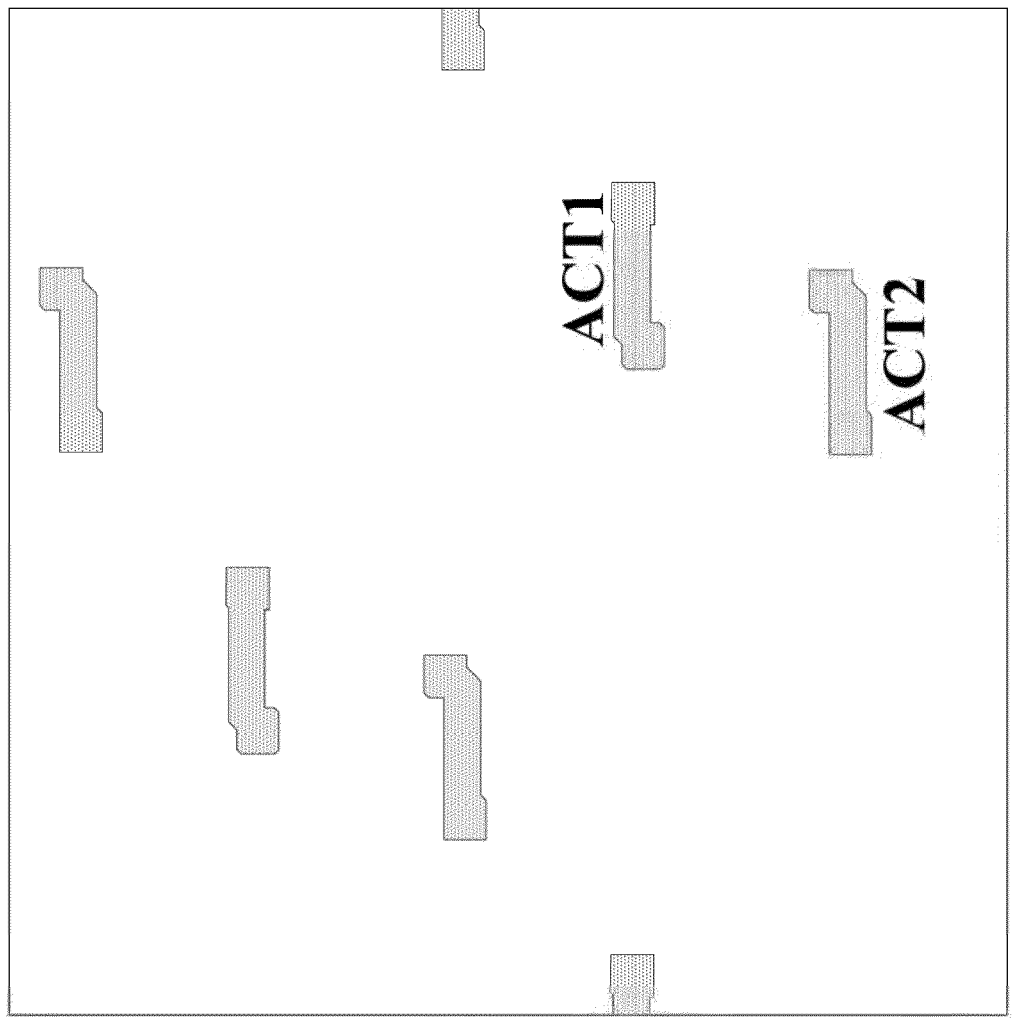
FIG. 8E illustrates the structure of a second semiconductor material layer in a zoom-in region ZR in FIG. 5.
Figure 8F:
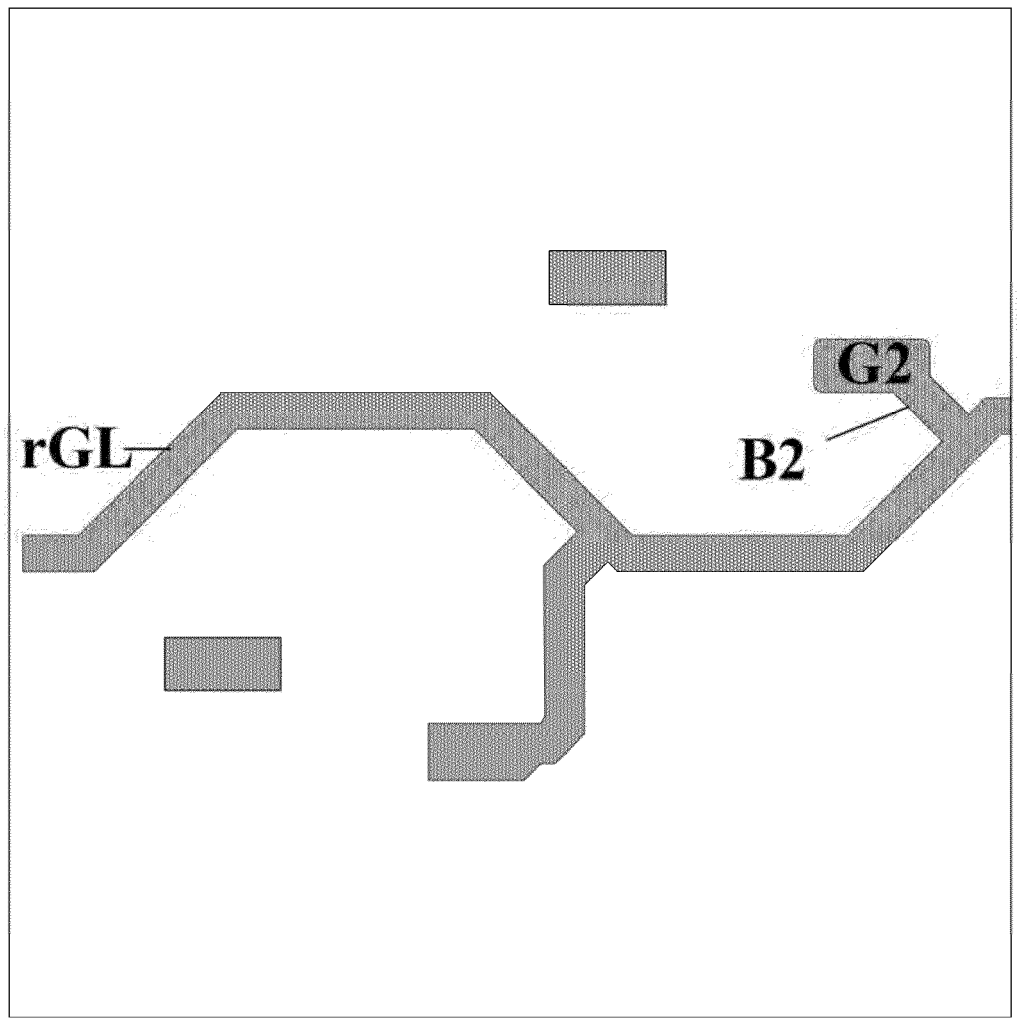
FIG. 8F illustrates the structure of a third conductive layer in a zoom-in region ZR in FIG. 5.
Figure 8G:
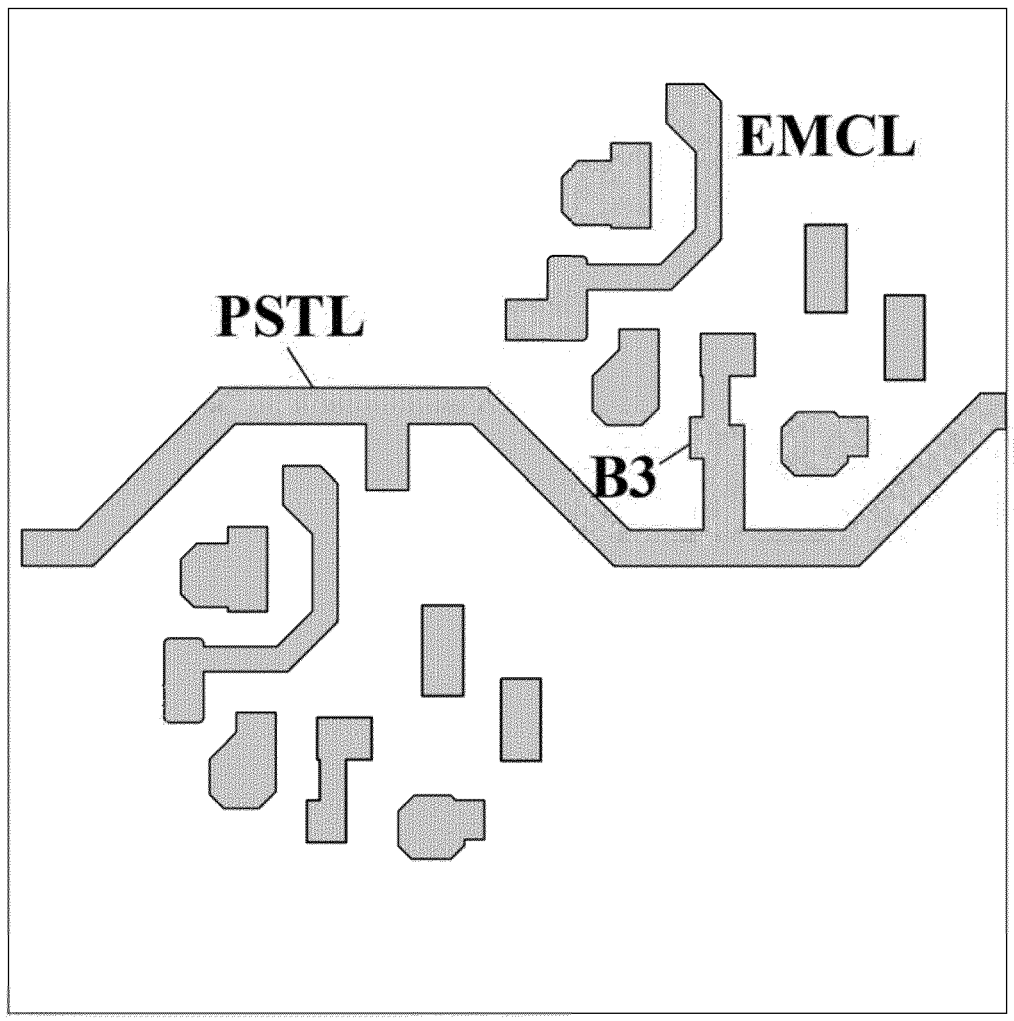
FIG. 8G illustrates the structure of a first signal line layer in a zoom-in region ZR in FIG. 5.
Figure 8H:
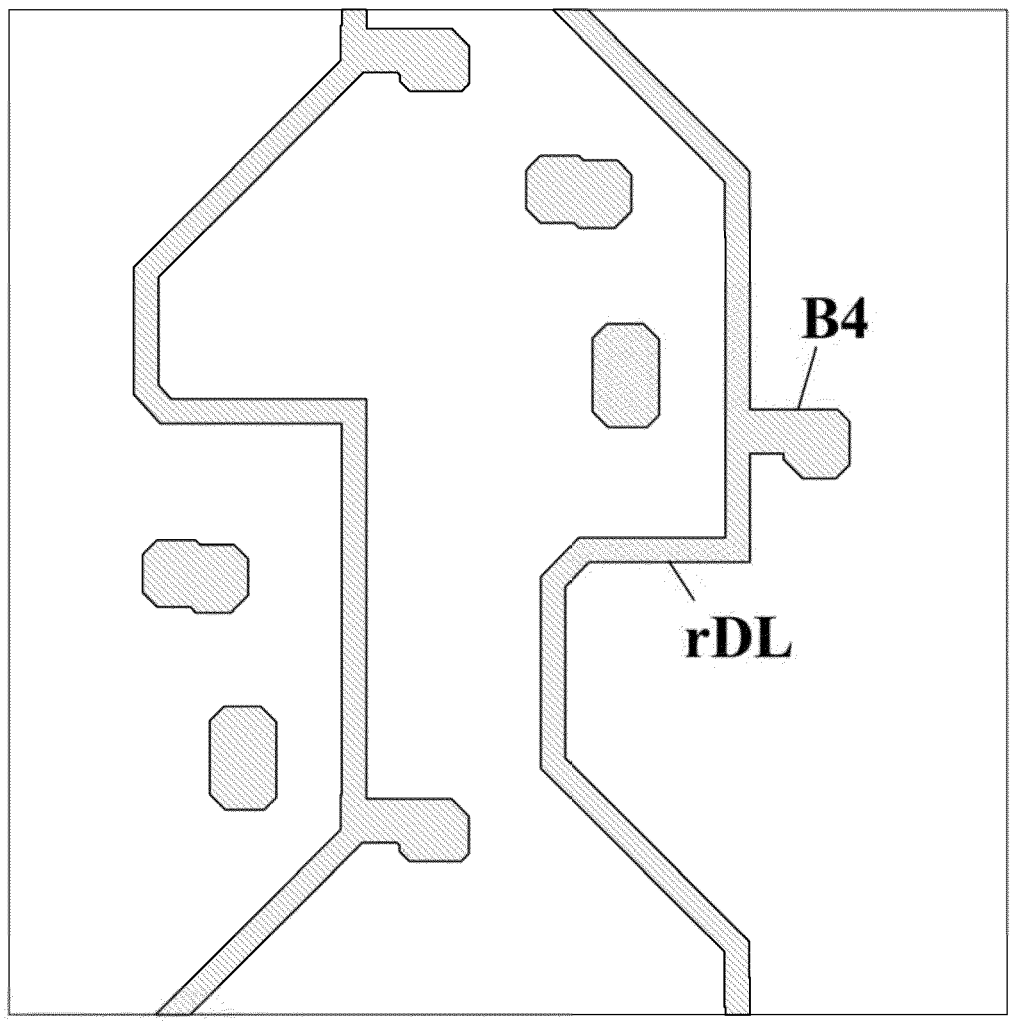
FIG. 8H illustrates the structure of a second signal line layer in a zoom-in region ZR in FIG. 5.
Figure 8I:
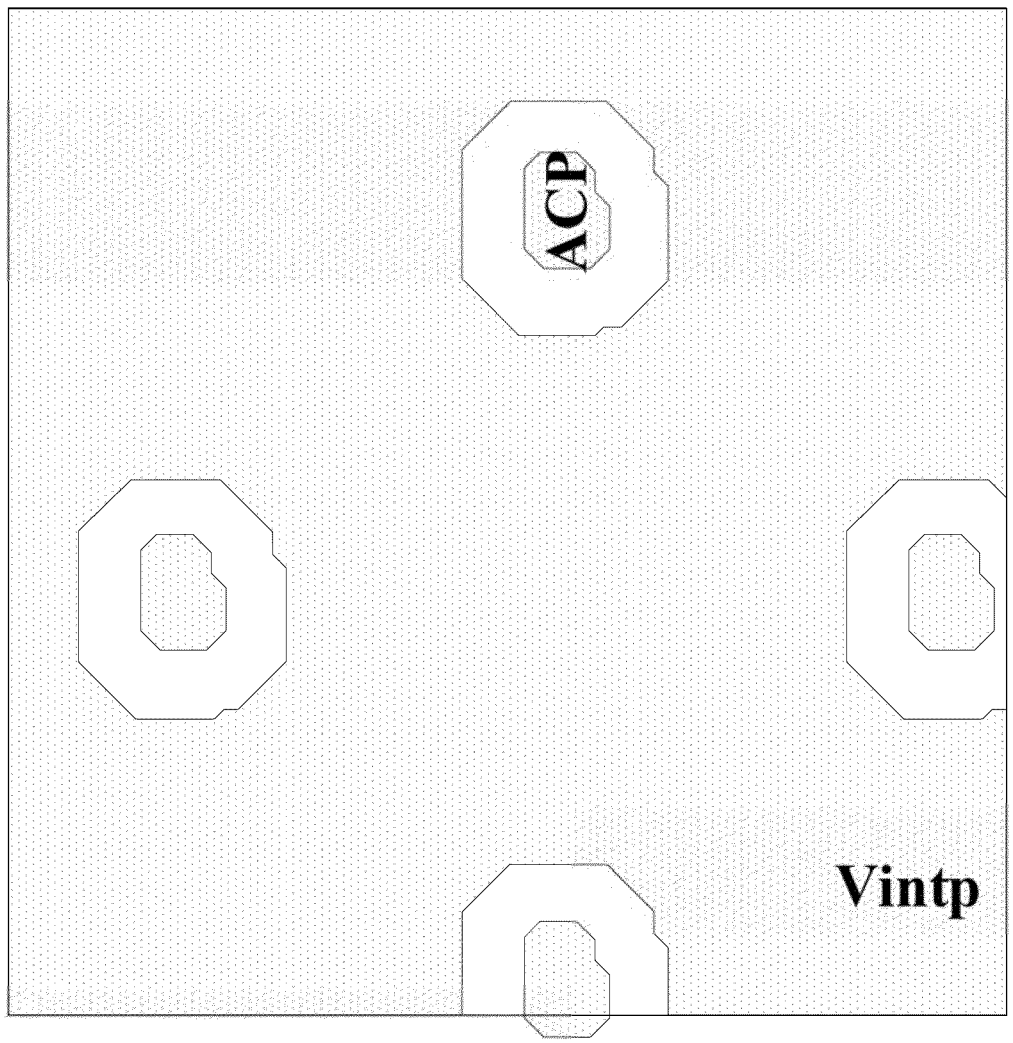
FIG. 8I illustrates the structure of a third signal line layer in a zoom-in region ZR in FIG. 5.
Figure 8J:
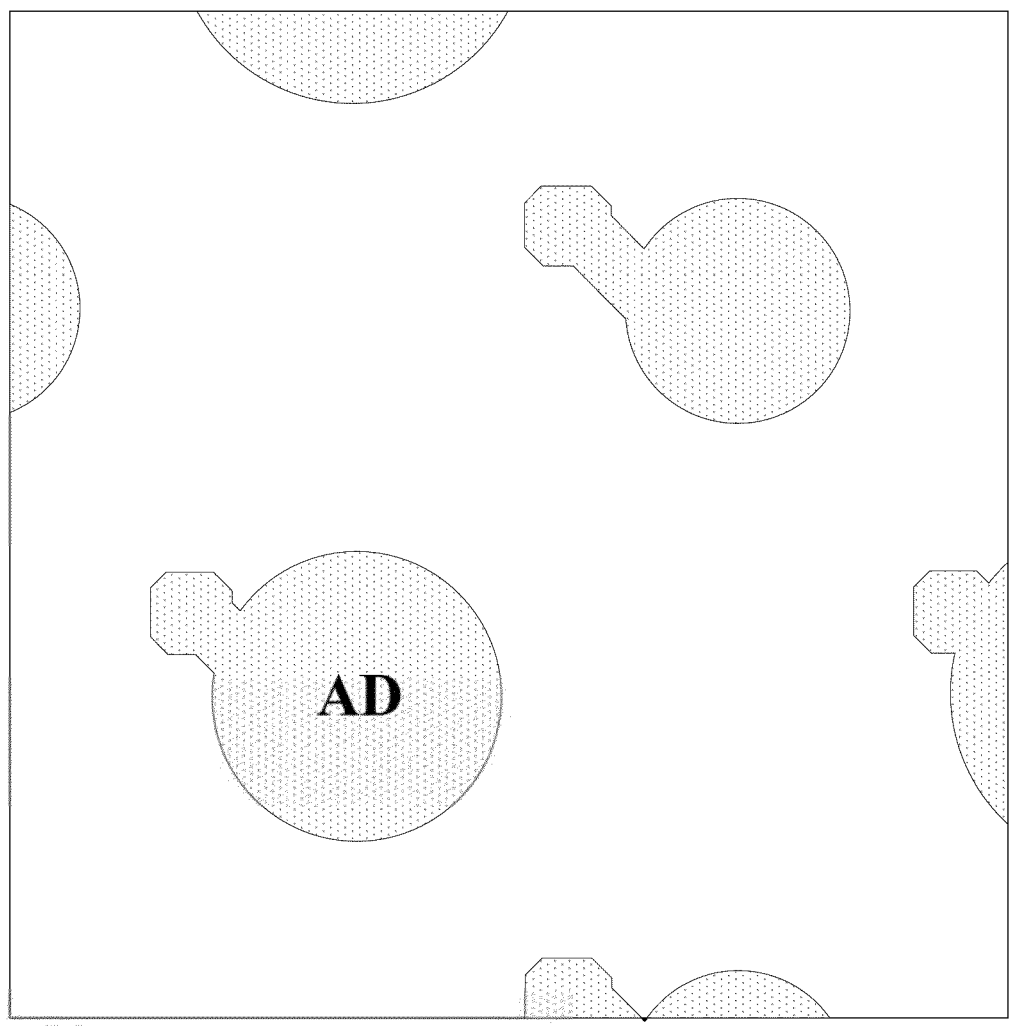
FIG. 8J illustrates the structure of an anode layer in a zoom-in region ZR in FIG. 5.
Figure 8K:
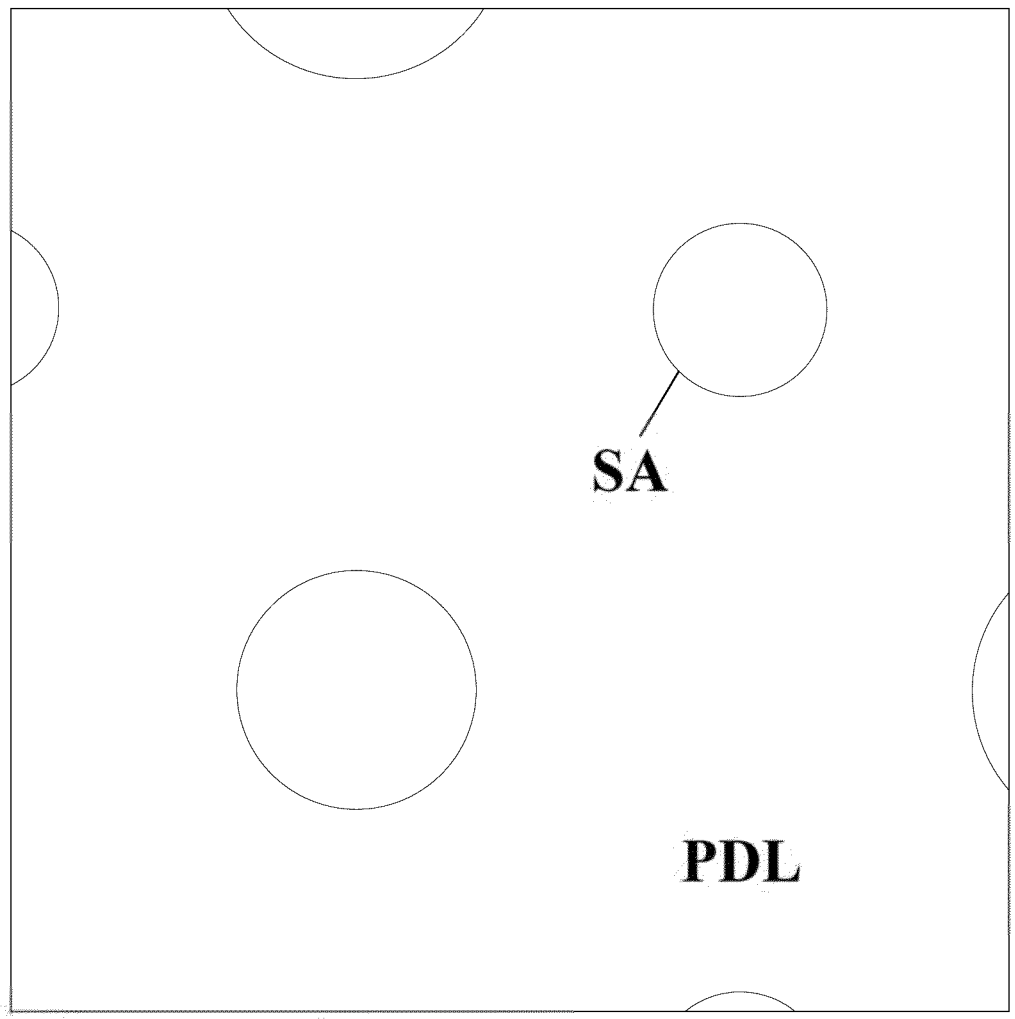
FIG. 8K illustrates the structure of a pixel definition layer in a zoom-in region ZR in FIG. 5.

FIG. 8A illustrates the structure of a light shielding layer in a zoom-in region ZR in FIG. 5. FIG. 8B illustrates the structure of a first semiconductor material layer in a zoom-in region ZR in FIG. 5. FIG. 8C illustrates the structure of a first conductive layer in a zoom-in region ZR in FIG. 5. FIG. 8D illustrates the structure of a second conductive layer in a zoom-in region ZR in FIG. 5. FIG. 8E illustrates the structure of a second semiconductor material layer in a zoom-in region ZR in FIG. 5. FIG. 8F illustrates the structure of a third conductive layer in a zoom-in region ZR in FIG. 5. FIG. 8G illustrates the structure of a first signal line layer in a zoom-in region ZR in FIG. 5. FIG. 8H illustrates the structure of a second signal line layer in a zoom-in region ZR in FIG. 5. FIG. 8I illustrates the structure of a third signal line layer in a zoom-in region ZR in FIG. 5. FIG. &J illustrates the structure of an anode layer in a zoom-in region ZR in FIG. 5. FIG. 8K illustrates the structure of a pixel definition layer in a zoom-in region ZR in FIG. 5. Referring to FIG. 3A, FIG. 5 to FIG. 7, and FIG. 8A to FIG. 8K, an active layer ACT1 of the first transistor T1 and an active layer ACT2 of the second transistor T2 are in the second semiconductor material layer. An active layer ACT3 of the third transistor T3 and an active layer ACT4 of the fourth transistor T4 are in the first semiconductor material layer.

In the first region, the light shielding layer includes a plurality of light shielding blocks LB and a light shielding block connecting line LBCL connecting the plurality of light shielding blocks LB. The light shielding block connecting line LBCL is configured to be provided with a power supply voltage, e.g., a same signal as the plurality of power supply voltage lines Vdd. Optionally, the third transistor T3 has a double gate structure, a respective light shielding block being the second gate electrode of the double gate structure. Optionally, the respective light shielding block is configured to be provided with a voltage of the plurality of power supply voltage lines Vdd.

In some embodiments, an orthographic projection of the respective light shielding block on a base substrate at least partially overlaps with an orthographic projection of the active layer ACT3 of the third transistor T3 on the base substrate. Optionally, the orthographic projection of the respective light shielding block on a base substrate covers the orthographic projection of the active layer ACT3 of the third transistor T3 on the base substrate.

In the first region, the first conductive layer includes a light emitting control signal line rem configured to provide a control signal to a gate electrode of an emission control transistor (e.g., the fourth transistor T4) in the respective first pixel driving circuit, a gate electrode G4 of the fourth transistor T4, and a first capacitor electrode Ce1 of a storage capacitor Cst of a respective first pixel driving circuit. The light emitting control signal line rem includes a plurality of first branches B1 extending away from a main line portion of the light emitting control signal line rem. A respective first branch is coupled to a gate electrode G1 of the first transistor T1 and a gate electrode G4 of the fourth transistor T4.

In the first region, the second conductive layer includes a gate electrode G1 of the first transistor T1, a gate electrode G2 of the second transistor T2, and a second capacitor electrode Ce2 of the storage capacitor Cst of the respective first pixel driving circuit. As discussed above, the gate electrode G1 of the first transistor T1 and the gate electrode G4 of the fourth transistor T4 are coupled to the respective first branch of the light emitting control signal line rem, thereby receiving a light emitting control signal.

In the first region, the third conductive layer includes a gate electrode G2 of the second transistor T2, and a gate line rGL configured to provide a control signal to a gate electrode of a data-write transistor (e.g., the second transistor T2) in the respective first pixel driving circuit. The gate line rGL includes a plurality of second branches B2 extending away from a main line portion of the gate line rGL. The gate electrode G2 of the second transistor T2 is a portion of a respective second branch.

In the first region, the first signal line layer includes a power supply transmission line PSTL configured to provide a voltage to a second capacitor electrode Ce2 of the storage capacitor Cst in the respective first pixel driving circuit. The power supply transmission line PSTL is configured to be provided with a power supply voltage, e.g., a same signal as the plurality of power supply voltage lines Vdd. Optionally, the power supply transmission line PSTL is coupled to a respective power supply voltage line of the plurality of power supply voltage lines Vdd.

The power supply transmission line PSTL includes a plurality of third branches B3 extending away from a main line portion of the power supply transmission line PSTL. A respective third branch is coupled to second capacitor electrode Ce2 of the storage capacitor Cst in the respective first pixel driving circuit, thereby providing a power supply voltage signal to the second capacitor electrode Ce2.

In the first region, the first signal line layer further includes a light emitting control signal connecting line EMCL configured to connect a respective first branch of the plurality of first branches B1 in the first conductive layer to a gate electrode G1 of the first transistor T1 and to a gate electrode G4 of the fourth transistor T4.

In the first region, the second signal line layer includes a data line rDL configured to provide data signals to the respective first pixel driving circuit. The data line rDL includes a plurality of fourth branches B4 extending away from a main line portion of the data line rDL. A source electrode of the second transistor T2 is part of a respective fourth branch of the plurality of fourth branches B4. The data line rDL is configured to provide data signals to the source electrode of the second transistor T2.

In the first region, the third signal line layer includes a reset signal plate Vintp configured to provide a reset signal to the plurality of first pixel driving circuits. The reset signal plate Vintp is configured to provide a reset signal to a source electrode of first transistor T1.

In some embodiments, the reset signal plate Vintp is a unitary plate in the first region. By having a unitary reset signal plate in the first region, the impedance of the reset signal plate can be lowered. Optionally, the reset signal plate Vintp is made of a transparent conductive material, e.g., a transparent conductive metal oxide material such as indium tin oxide, enhancing the light transmittance in the first region.

In the first region, the third signal line layer further includes a plurality of anode connecting pads ACP and a plurality of apertures extending through the reset signal plate Vintp. The plurality of anode connecting pads ACP are in the plurality of apertures, respectively. The plurality of anode connecting pads ACP are electrically separated from the reset signal plate Vintp. The plurality of anode connecting pads ACP are spaced apart from each other. A respective anode connecting pad is spaced apart from the reset signal plate Vintp. The plurality of anode connecting pads ACP are coupled to a plurality of anodes of the plurality of first light emitting elements, respectively.

In the first region, the anode layer ADL includes a plurality of anodes AD. A respective anode of the plurality of anodes AD is connected to a respective anode connecting pad of the plurality of anode connecting pads ACP.

In the first region, the pixel definition layer PDL defines a plurality of subpixel apertures SA corresponding to the plurality anodes AD.

In some embodiments, referring to FIG. 8B and FIG. 8E, in the first region, along a first direction, an orthographic projection of an active layer ACT1 of a reset transistor (T1) on a base substrate and an orthographic projection of an active layer ACT2 of a data write transistor on the base substrate are on two opposite sides of an orthographic projection of an active layer ACT3 of a driving transistor on the base substrate. The active layer ACT3 of the driving transistor is in a first semiconductor material layer. The active layer ACT1 of the reset transistor and the active layer ACT2 of the data write transistor are in the second semiconductor material layer.

In some embodiments, referring to FIG. 8B and FIG. 8L, an orthographic projection of the data line rDL on a base substrate at least partially overlap with an orthographic projection of active layers of driving transistors (e.g., ACT3 of the third transistor) in a column of pixel driving circuits on the base substrate.

Figure 9A:
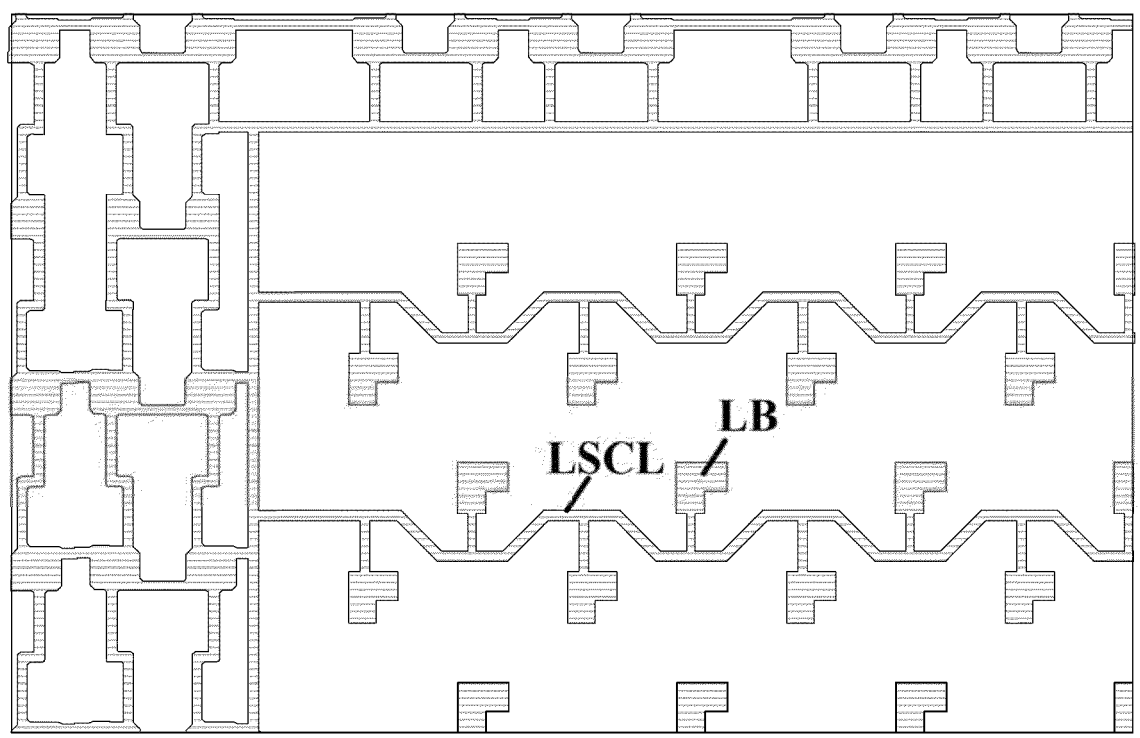
FIG. 9A illustrates the structure of a light shielding layer in the array substrate depicted in FIG. 5.
Figure 9B:
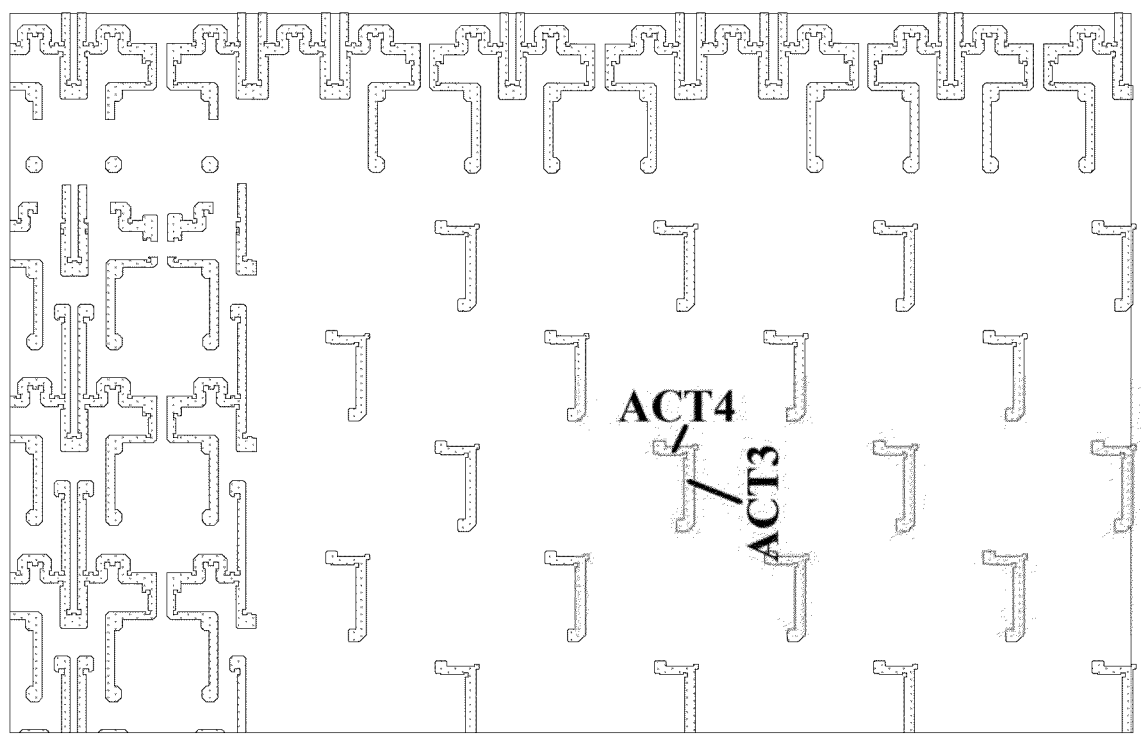
FIG. 9B illustrates the structure of a first semiconductor material layer in the array substrate depicted in FIG. 5.
Figure 9C:
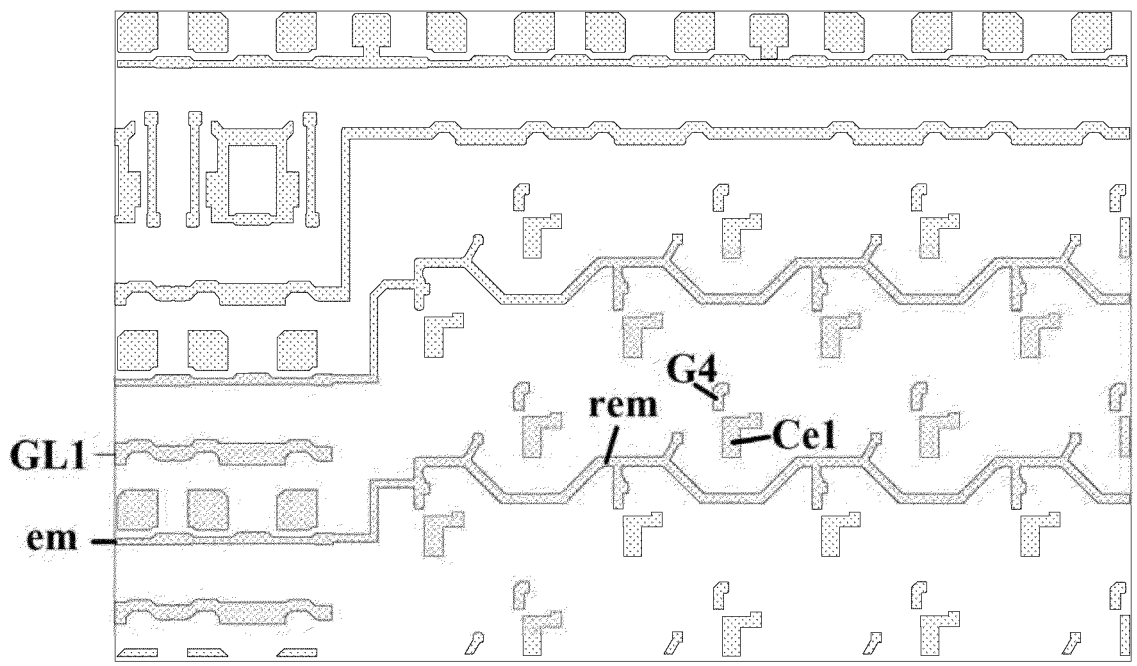
FIG. 9C illustrates the structure of a first conductive layer in the array substrate depicted in FIG. 5.
Figure 9D:
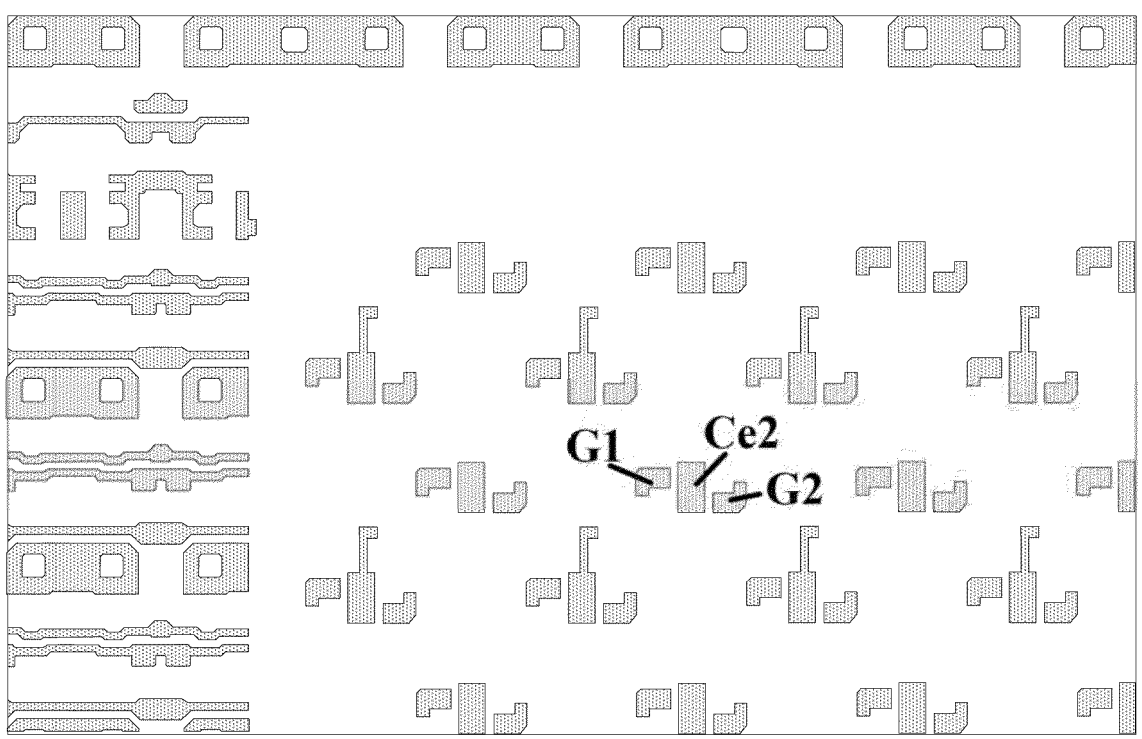
FIG. 9D illustrates the structure of a second conductive layer in the array substrate depicted in FIG. 5.
Figure 9E:
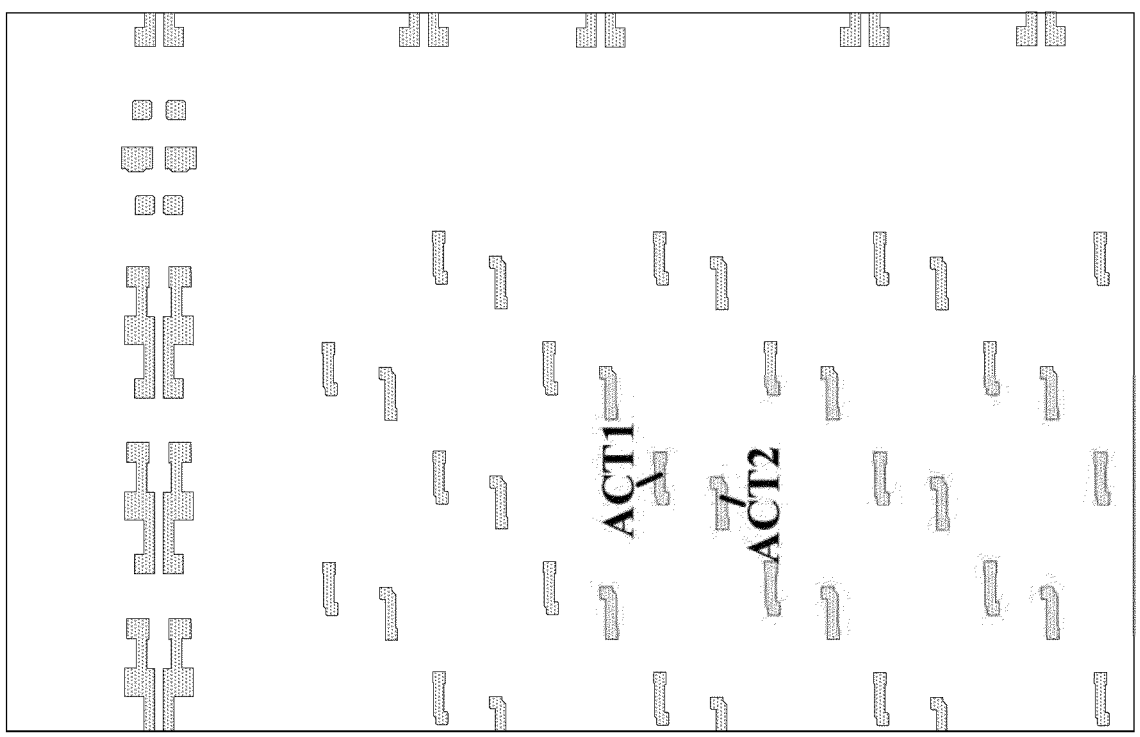
FIG. 9E illustrates the structure of a second semiconductor material layer in the array substrate depicted in FIG. 5.
Figure 9F:
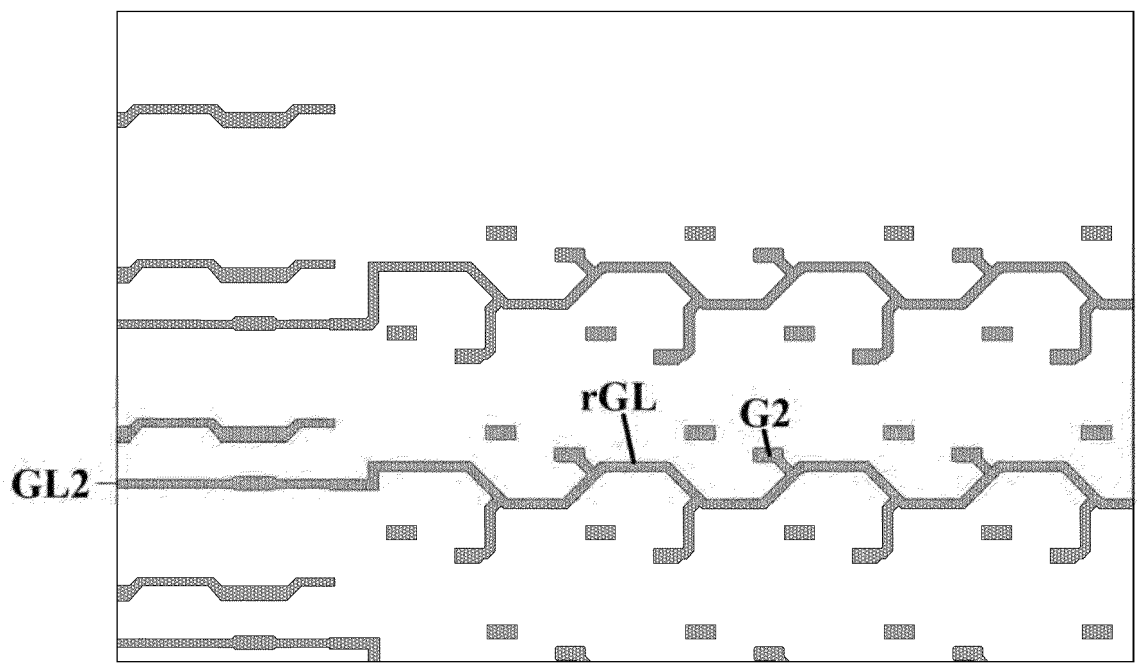
FIG. 9F illustrates the structure of a third conductive layer in the array substrate depicted in FIG. 5.
Figure 9G:
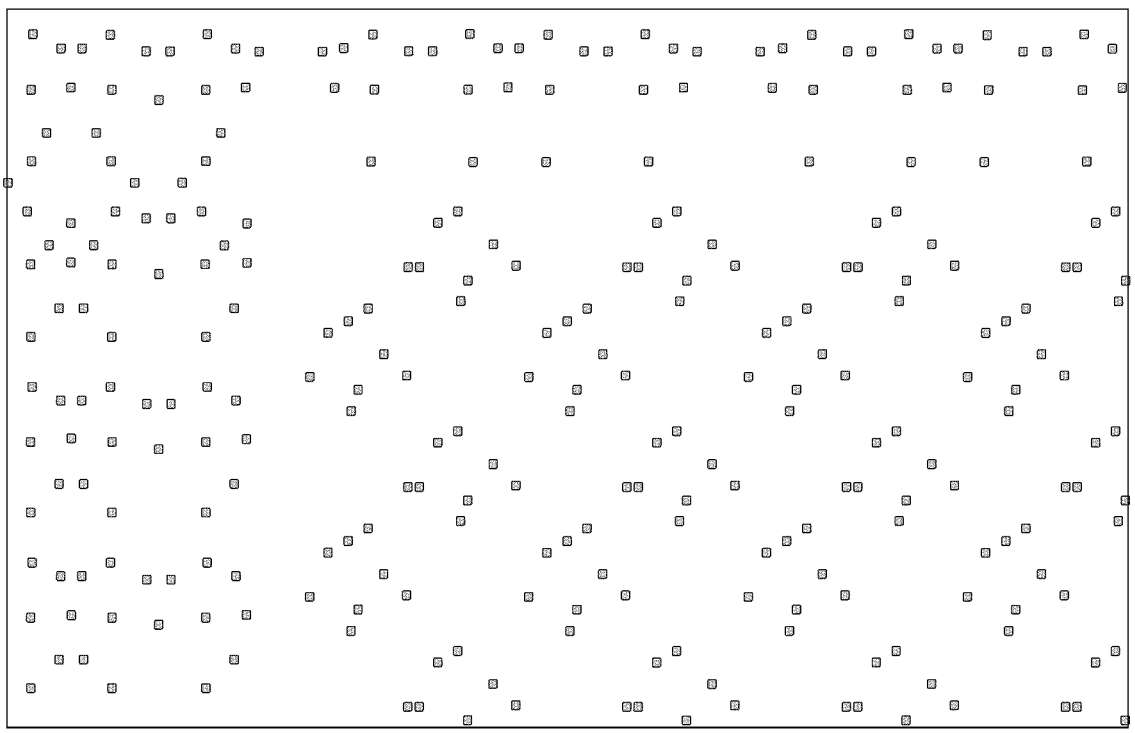
FIG. 9G illustrates the structure of a first inter-layer dielectric layer in the array substrate depicted in FIG. 5.
Figure 9H:
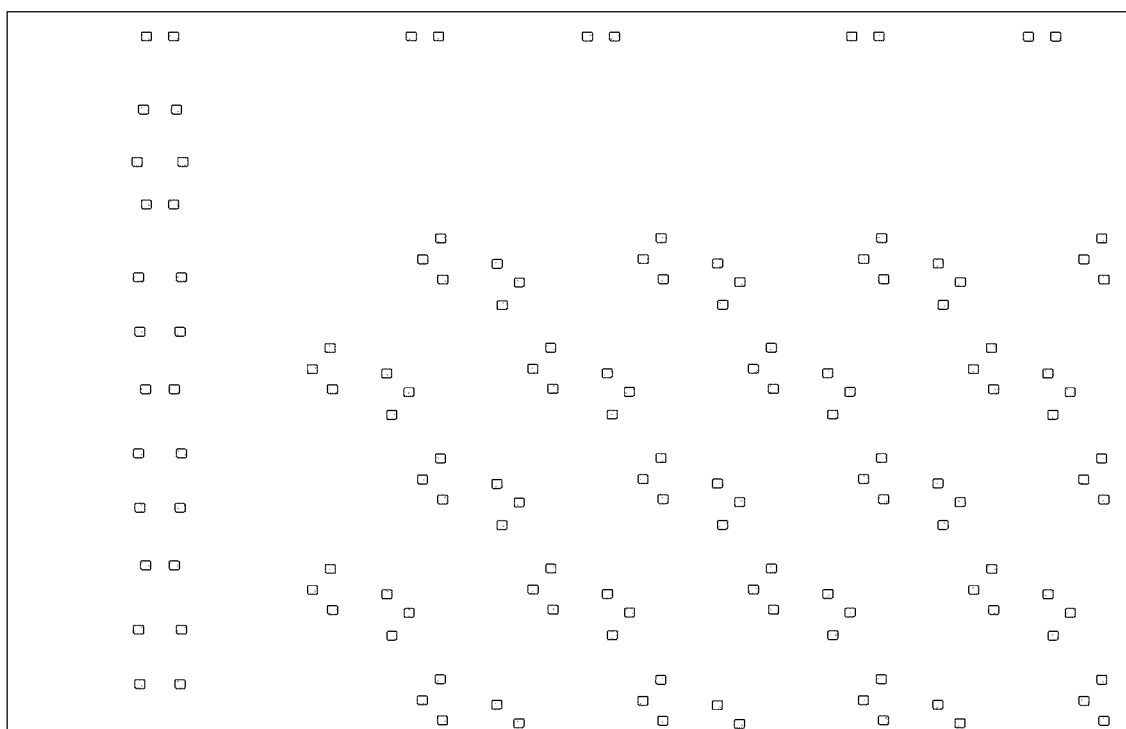
FIG. 9H illustrates the structure of a second inter-layer dielectric layer in the array substrate depicted in FIG. 5.
Figure 9I:
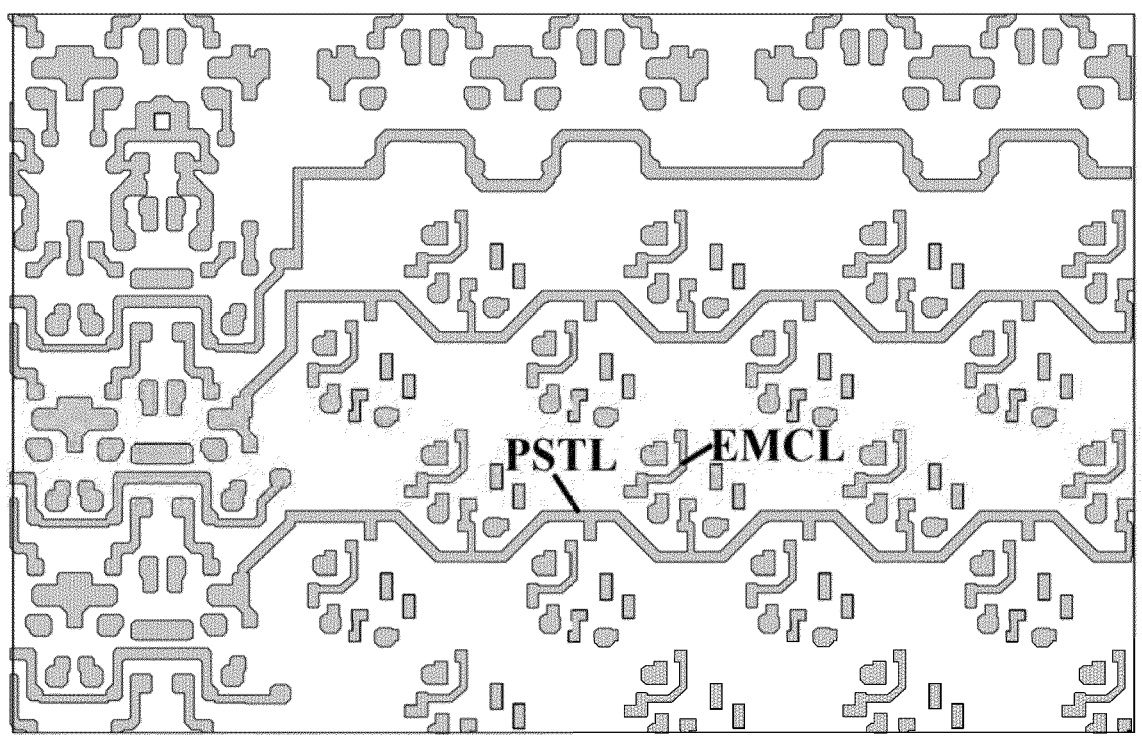
FIG. 9I illustrates the structure of a first signal line layer in the array substrate depicted in FIG. 5.
Figure 9J:
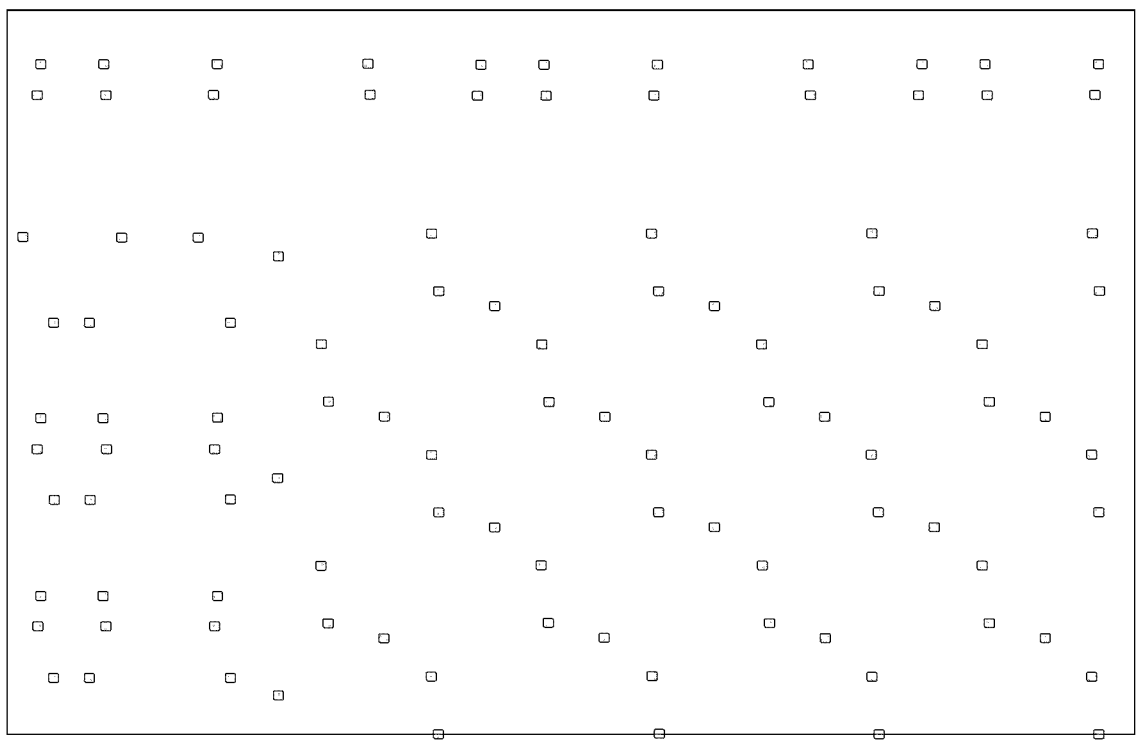
FIG. 9J illustrates the structure of a passivation layer in the array substrate depicted in FIG. 5.
Figure 9K:
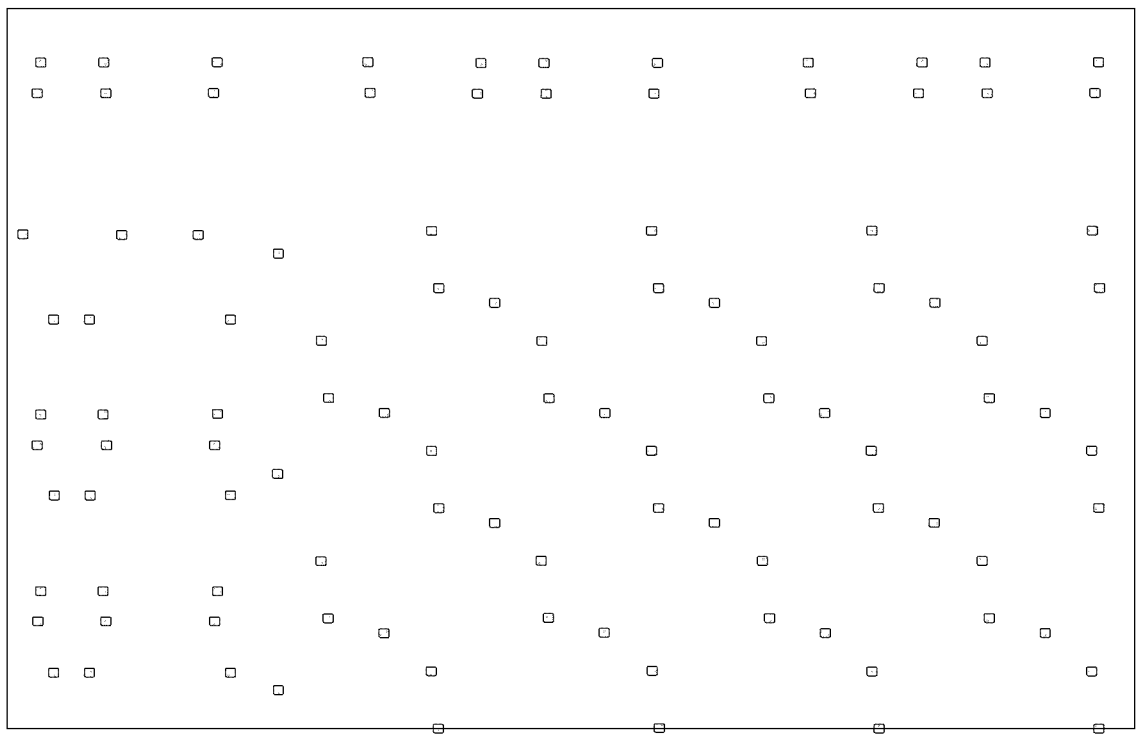
FIG. 9K illustrates the structure of a first planarization layer in the array substrate depicted in FIG. 5.
Figure 9L:
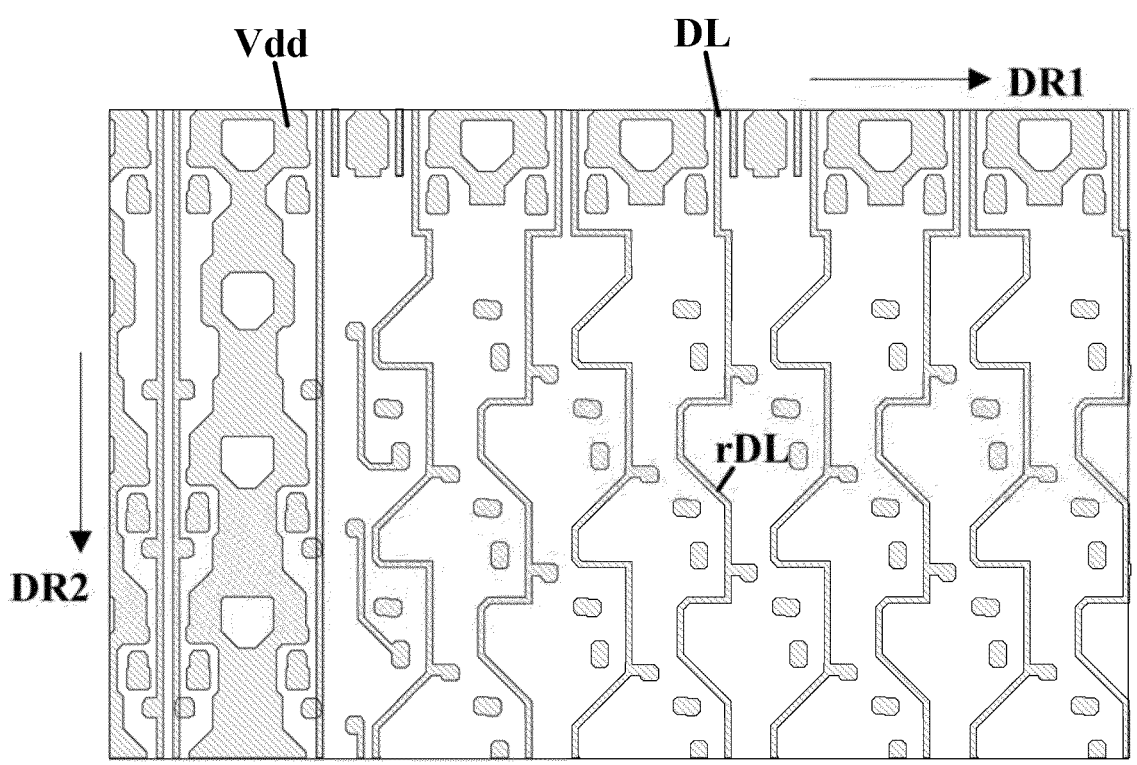
FIG. 9L illustrates the structure of a second signal line layer in the array substrate depicted in FIG. 5.
Figure 9M:
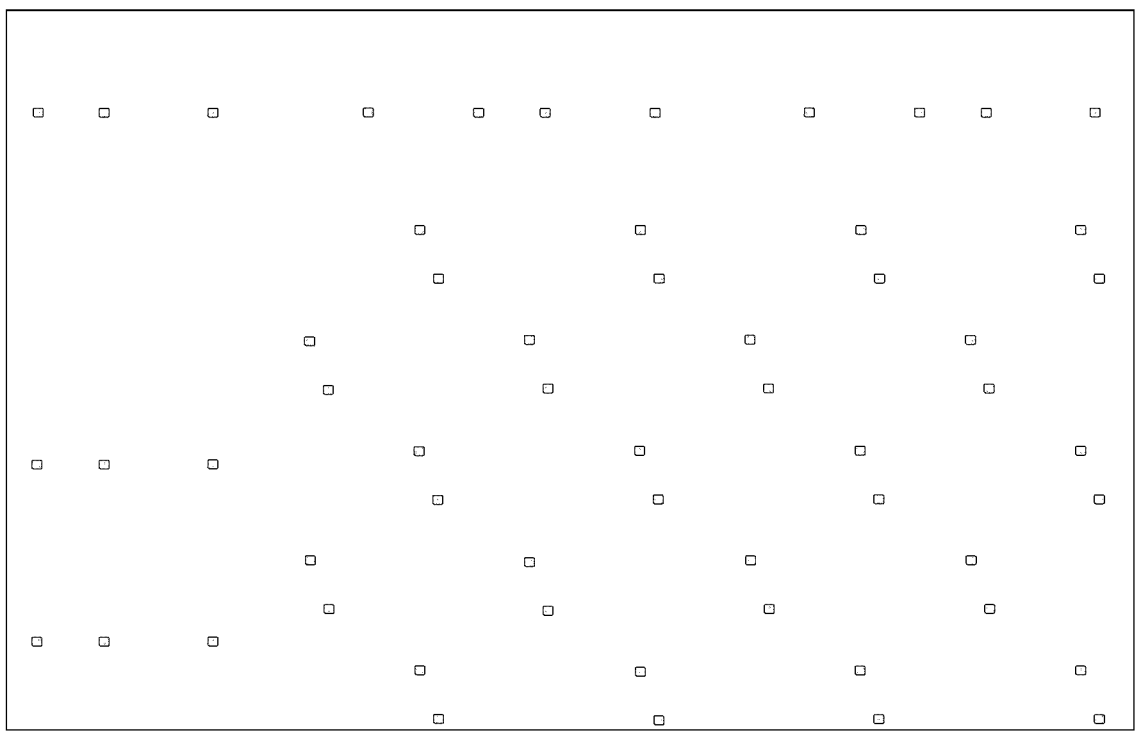
FIG. 9M illustrates the structure of a second planarization layer in the array substrate depicted in FIG. 5.
Figure 9N:
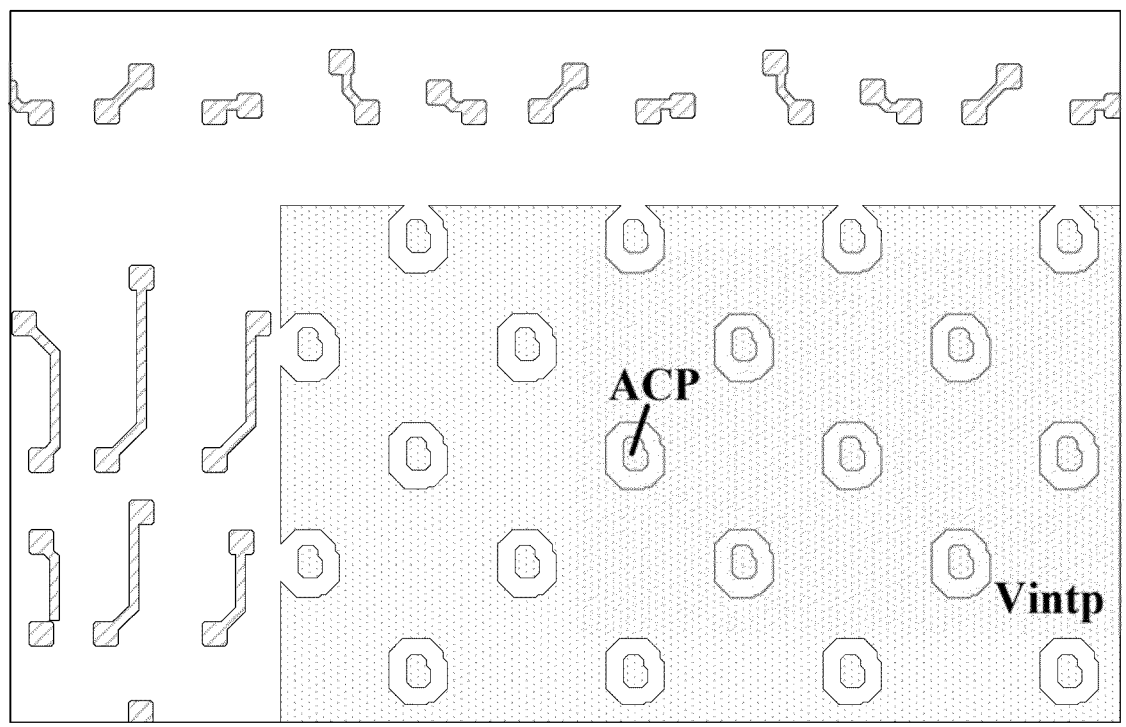
FIG. 9N illustrates the structure of a third signal line layer in the array substrate depicted in FIG. 5.
Figure 9O:
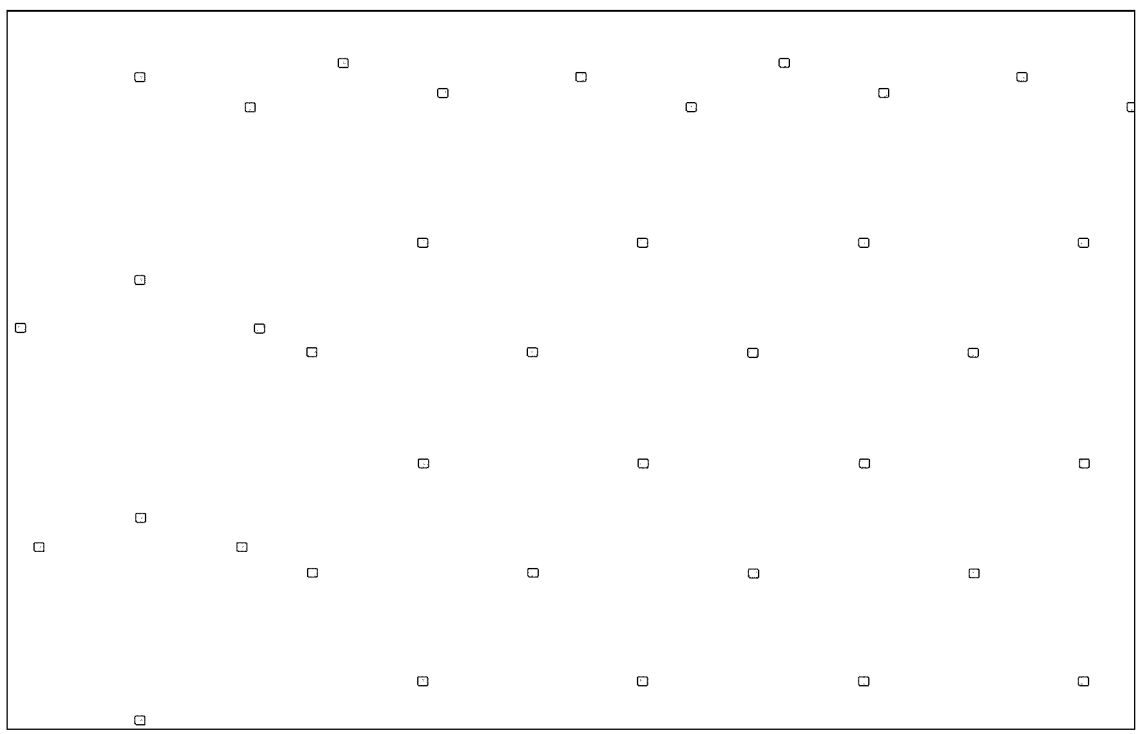
FIG. 9O illustrates the structure of a third planarization layer in the array substrate depicted in FIG. 5.
Figure 9P:
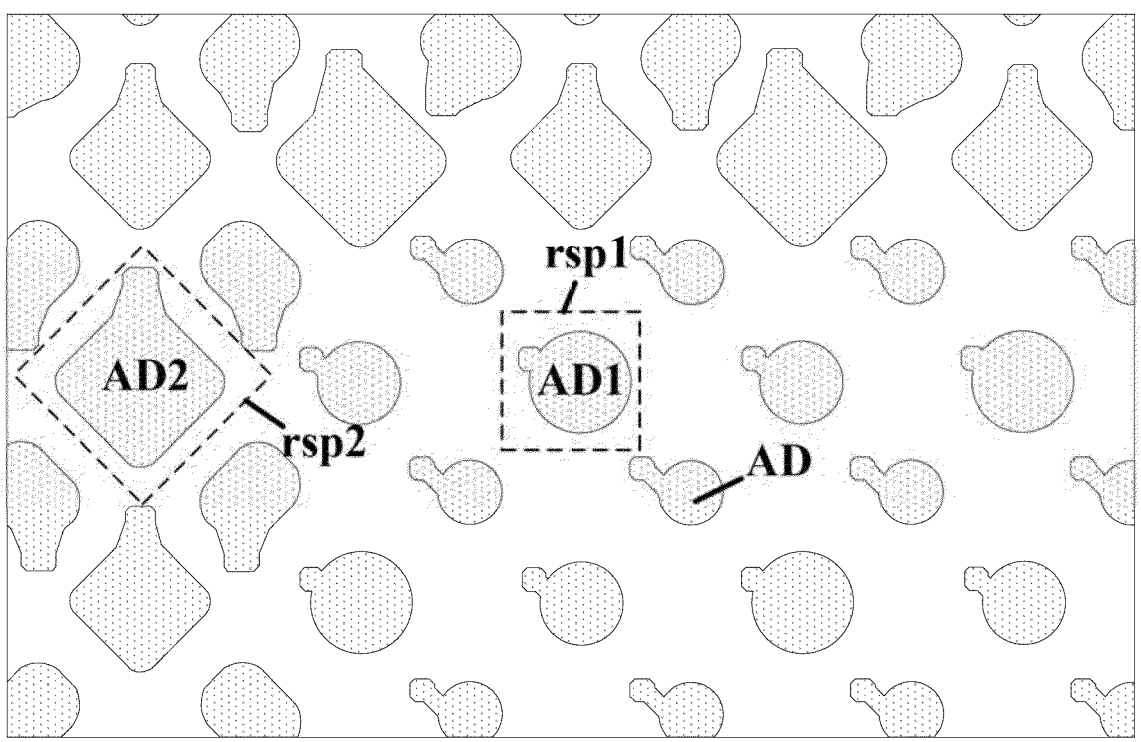
FIG. 9P illustrates the structure of an anode layer in the array substrate depicted in FIG. 5.
Figure 9Q:
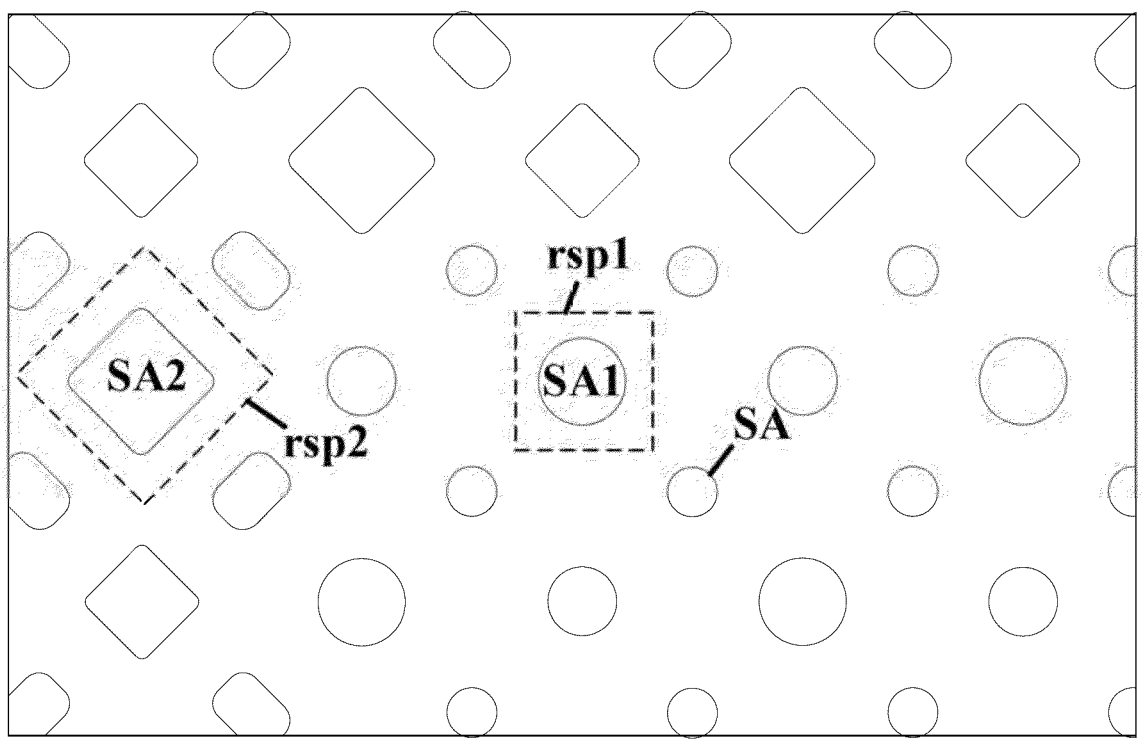
FIG. 9Q illustrates the structure of a pixel definition layer in the array substrate depicted in FIG. 5.

FIG. 9A illustrates the structure of a light shielding layer in the array substrate depicted in FIG. 5. FIG. 9B illustrates the structure of a first semiconductor material layer in the array substrate depicted in FIG. 5. FIG. 9C illustrates the structure of a first conductive layer in the array substrate depicted in FIG. 5. FIG. 9D illustrates the structure of a second conductive layer in the array substrate depicted in FIG. 5. FIG. 9E illustrates the structure of a second semiconductor material layer in the array substrate depicted in FIG. 5. FIG. 9F illustrates the structure of a third conductive layer in the array substrate depicted in FIG. 5. FIG. 9G illustrates the structure of a first inter-layer dielectric layer in the array substrate depicted in FIG. 5. FIG. 9H illustrates the structure of a second inter-layer dielectric layer in the array substrate depicted in FIG. 5. FIG. 9I illustrates the structure of a first signal line layer in the array substrate depicted in FIG. 5. FIG. 9J illustrates the structure of a passivation layer in the array substrate depicted in FIG. 5. FIG. 9K illustrates the structure of a first planarization layer in the array substrate depicted in FIG. 5. FIG. 9L illustrates the structure of a second signal line layer in the array substrate depicted in FIG. 5. FIG. 9M illustrates the structure of a second planarization layer in the array substrate depicted in FIG. 5. FIG. 9N illustrates the structure of a third signal line layer in the array substrate depicted in FIG. 5. FIG. 9O) illustrates the structure of a third planarization layer in the array substrate depicted in FIG. 5. FIG. 9P illustrates the structure of an anode layer in the array substrate depicted in FIG. 5. FIG. 9Q illustrates the structure of a pixel definition layer in the array substrate depicted in FIG. 5.

In some embodiments, referring to FIG. 9A, the light shielding block connecting line LSCL and the plurality of light shielding blocks LB in the first region is connected to a light shielding structure in the second region. The light shielding structure in the second region has a different structure from the light shielding structure in the first region.

Referring to FIG. 9C, the light emitting control signal line rem in the first region is part of a respective light emitting control signal line of a plurality of light emitting control signal lines em in the second region. Thus, the respective light emitting control signal line of the plurality of light emitting control signal lines em extends continuously through the first region and the second region. The respective light emitting control signal line extending continuously through the first region and the second region has different shapes in the first region and the second region. In one example, the portion of the respective light emitting control signal line in the first region is a zig-zag line portion, whereas the portion of the respective light emitting control signal line in the second region is a substantially straight line portion.

Referring to FIG. 9C, at least one signal line in the first conductive layer continuously extending in the second region discontinues in the first region Examples of such signal lines include a plurality of first gate lines GL1 in the second region configured to provide signals to the plurality of second pixel driving circuits in the second region.

Referring to FIG. 9D, at least one signal line in the second conductive layer continuously extending in the second region discontinues in the first region. Examples of such signal lines include one or more of a reset control signal line and a reset signal line configured to provide signals to the plurality of second pixel driving circuits in the second region.

Referring to FIG. 9F, a gate line rGL in the first region is part of a respective second gate line of a plurality of second gate lines GL2. The respective second gate line of the plurality of second gate lines G2 extends continuously through the first region and the second region. The respective second gate line extending continuously through the first region and the second region has different shapes in the first region and the second region. In one example, the portion of the respective second gate line in the first region (the gate lien rGL) is a zig-zag line portion, whereas the portion of the respective second gate line in the second region is a substantially straight line portion.

FIG. 9G illustrates vias extending through a first inter-layer dielectric layer.

FIG. 9H illustrates vias extending through a second inter-layer dielectric layer.

Referring to FIG. 9I, the power supply transmission line PSTL continuously extending in the first region discontinues in the second region. Referring to FIG. 9L, the array substrate includes a plurality of power supply voltage lines Vdd in the second region. The plurality of power supply voltage lines Vdd is absent in the first region. Referring to FIG. 9A, FIG. 9I, and FIG. 9L, a respective power supply voltage line of the plurality of power supply voltage lines Vdd is connected to the power supply transmission line PSTL through a via extending an insulating layer (e.g., the passivation layer and/or the first planarization layer), thereby providing the power supply voltage signal to the power supply transmission line PSTL.

FIG. 9J illustrates vias extending through a passivation layer.

FIG. 9K illustrates vias extending through a first planarization layer.

Referring to FIG. 9L, the array substrate further includes a plurality of data lines DL The data line rDL in the first region is part of a respective data line of the plurality of data lines DL. The respective data line of a plurality of data lines DL extends continuously through the first region and the second region. The respective data line extending continuously through the first region and the second region has different shapes in the first region and the second region. In one example, the portion of the respective data line in the first region (the data line rDL) is a zig-zag line portion, whereas the portion of the respective data line in the second region is a substantially straight line portion.

Figure 10:
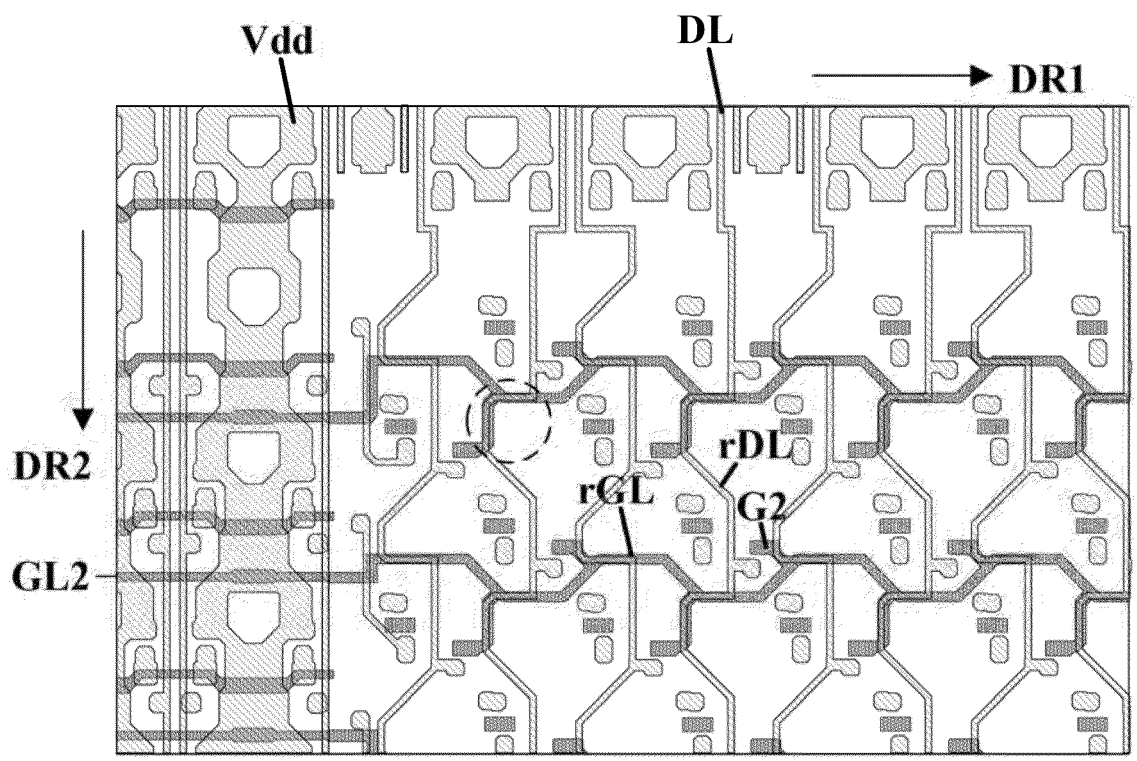
FIG. 10 is a superimposition of a third conductive layer and a second signal line layer in the array substrate depicted in FIG. 5.

In some embodiments, the respective data line extends along a second direction DR2. Referring to FIG. 5 and FIG. 9L, at least a portion of the respective data line (e.g., a portion of the data line rDL) extends along a first direction DR1. FIG. 10 is a superimposition of a third conductive layer and a second signal line layer in the array substrate depicted in FIG. 5. Referring to FIG. 10, the respective second gate line of the plurality of second gate lines extend along the first direction. At least a portion of the respective data line (a portion of the data line rDL) and a portion of a signal line extending along a first direction (a portion of the gate line rGL) have conforming shapes and substantially parallel extension directions, in a region encircled by dotted lines. By having this structure, the light transmittance in the first region can be further enhanced. Orthographic projections of the portion of the respective data line (the portion of the data line rDL) and the portion of the signal line (the portion of the gate line rGL) on a base substrate at least partially overlap with each other.

Similarly, referring to FIG. 5, FIG. 9I, and FIG. 9L, at least a portion of the respective data line (a portion of the data line rDL) and a portion of the power supply transmission line PSTL have conforming shapes and substantially parallel extension directions. Orthographic projections of the portion of the respective data line (the portion of the data line rDL) and the portion of the power supply transmission line PSTL on a base substrate at least partially overlap with each other.

Similarly, referring to FIG. 5, FIG. 9C, and FIG. 9L, at least a portion of the respective data line (a portion of the data line rDL) and a portion of the light emitting control signal line rem have conforming shapes and substantially parallel extension directions. Orthographic projections of the portion of the respective data line (the portion of the data line rDL) and the portion of the light emitting control signal line rem on a base substrate at least partially overlap with each other.

Similarly, referring to FIG. 5, FIG. 9A, and FIG. 9L, at least a portion of the respective data line (a portion of the data line rDL) and a portion of the light shielding block connecting line LSCL have conforming shapes and substantially parallel extension directions. Orthographic projections of the portion of the respective data line (the portion of the data line (DL) and the portion of the light shielding block connecting line LSCL on a base substrate at least partially overlap with each other.

FIG. 9M illustrates vias extending through a second planarization layer.

Referring to FIG. 9N, the reset signal plate Vintp is absent in the second region. The reset signal plate Vintp is configured to be provided with a same signal as a plurality of reset signal lines in the second region. Optionally, the reset signal plate Vintp is coupled to one of the plurality of reset signal lines in the second region.

FIG. 9O illustrates vias extending through a third planarization layer.

Referring to FIG. 9P, for a first subpixel rsp1 in the first region and a second subpixel rsp2 in the second region configured to emit light of a same color (e.g., a red color), a first anode AD1 of a first light emitting element in the first subpixel rsp has an area smaller than a second anode AD2 of a second light emitting element in the second subpixel rsp2, for example, by at least 5%, by at least 10%, by at least 15%, by at least 20%, by at least 25%, by at least 30%, by at least 35%, by at least 40%, by at least 45%, by at least 50%, by at least 55%, by at least 60%, by at least 65%, by at least 70%, by at least 75%, or by at least 80%. By having a smaller anode in the first region, the light transmittance in the first region can be further enhanced.

Referring to FIG. 9Q, for a first subpixel rsp1 in the first region and a second subpixel rsp2 in the second region configured to emit light of a same color (e.g., a red color), a first subpixel aperture SA1 of the first subpixel rsp1 has an area smaller than a second subpixel aperture SA2 of the second subpixel rsp2, for example, by at least 5%, by at least 10%, by at least 15%, by at least 20%, by at least 25%, by at least 30%, by at least 35%, by at least 40%, by at least 45%, by at least 50%, by at least 55%, by at least 60%, by at least 65%, by at least 70%, by at least 75%, or by at least 80%.

In some embodiments, referring to FIG. 9B and FIG. 9E, in the first region, along a first direction, an orthographic projection of an active layer ACT1 of a reset transistor (T1) on a base substrate and an orthographic projection of an active layer ACT2 of a data write transistor on the base substrate are on two opposite sides of an orthographic projection of an active layer ACT3 of a driving transistor on the base substrate. The active layer ACT3 of the driving transistor is in a first semiconductor material layer. The active layer ACT1 of the reset transistor and the active layer ACT2 of the data write transistor are in the second semiconductor material layer.

In some embodiments, referring to FIG. 9B and FIG. 9L, an orthographic projection of the data line rDL on a base substrate at least partially overlap with an orthographic projection of active layers of driving transistors (e.g., ACT3 of the third transistor) in a column of pixel driving circuits on the base substrate.

Referring to FIG. 5, FIG. 6, and FIG. 7, electrodes of transistors and capacitor of the respective first pixel driving circuit are clustered in a same region (e.g., the region encircled by dotted lines in FIG. 6) as a respective anode of a respective first light emitting element of the plurality of first light emitting elements. Optionally, the same region (e.g., the region encircled by dotted lines in FIG. 6) has an area no more than 50% (e.g., no more than 45%, no more than 40%, or no more than 35%) of an area of a respective first subpixel of the plurality of first subpixels. Optionally, the array substrate further includes a plurality of photodiodes in the first region configured to capture an image. The plurality of photodiodes are disposed outside the same region.

Figure 11:
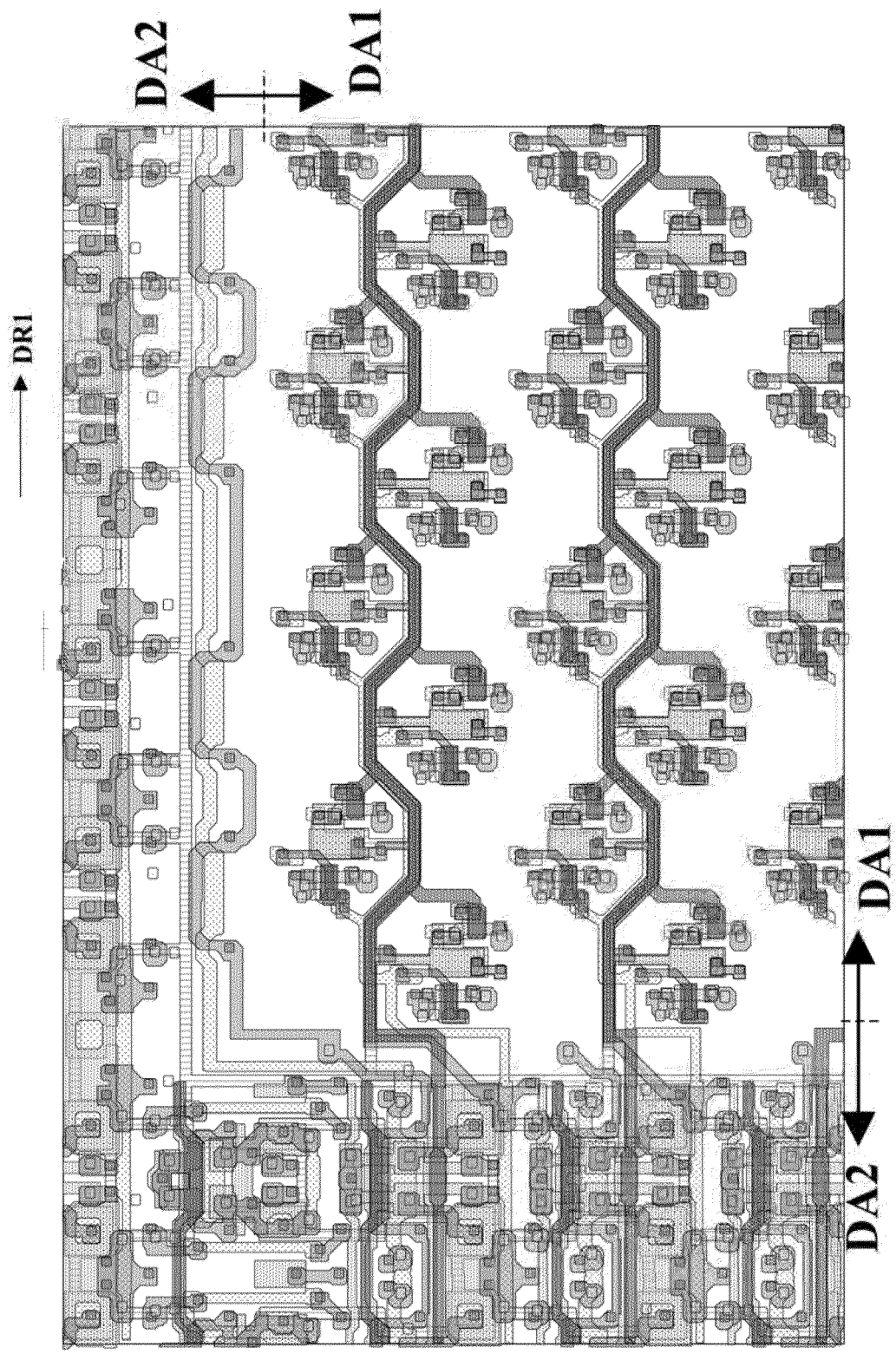
FIG. 11 is a superimposition of a light shielding layer, a first conductive layer, a third conductive layer, and a first signal line layer in the array substrate depicted in FIG. 5.

In some embodiments, the array substrate includes multiple signal lines in different layers extending at least partially through the first region along a first direction; orthographic projections of the multiple signal lines on a base substrate at least partially overlap with each other continuously over a length of at least two first subpixels along the first direction. FIG. 11 is a superimposition of a light shielding layer, a first conductive layer, a third conductive layer, and a first signal line layer in the array substrate depicted in FIG. 5. Referring to FIG. 9A, FIG. 9C, FIG. 9F, FIG. 9I, and FIG. 11, multiple signal lines in different layers extending along the first direction DR1 include at least two of a light shielding block connecting line LSCL in a light shielding layer; a light emitting control signal line rem in a first conductive layer configured to provide a control signal to a gate electrode of an emission control transistor in the respective first pixel driving circuit; a gate line rGL in a third conductive layer configured to provide a control signal to a gate electrode of a data-write transistor in the respective first pixel driving circuit; and a power supply transmission line PSTL in a first signal line layer configured to provide a voltage to a second capacitor electrode of a storage capacitor in the respective first pixel driving circuit. Optionally, the multiple signal lines in different layers extending along the first direction DR1 include the light shielding block connecting line LSCL, the light emitting control signal line rem, the gate line rGL, the power supply transmission line PSTL.

As shown in FIG. 11, orthographic projections of the multiple signal lines on a base substrate at least partially overlap with each other continuously over a length of at least two first subpixels along the first direction DR1. In one example, the orthographic projections of the multiple signal lines on a base substrate at least partially overlap with each other continuously over a length of an entire row of first subpixels along the first direction DR1.

In some embodiments, the multiple signal lines have conforming shapes and substantially parallel extension directions where the orthographic projections of the multiple signal lines overlap with each other continuously over the length of at least two first subpixels. In one example, the multiple signal lines have conforming shapes and substantially parallel extension directions where the orthographic projections of the multiple signal lines overlap with each other continuously over the length of an entire row of first subpixels along the first direction DR1.

Optionally, at least one of the multiple signal lines (e.g., a respective second gate line of the plurality of second gate lines GL2, the gate line rGL being a portion of the respective second gate line) extends, in a same layer, from the second region into the first region, and is configured to provide signals to multiple first subpixels in the first region and multiple second subpixel in the second region.

Optionally, at least one of the multiple signal lines (e.g., the power supply transmission line PSTL) is configured to provide signals to multiple first subpixels in the first region but not to the plurality of second subpixels in the second region.

Optionally, at least one of the multiple signal lines (e.g., the power supply transmission line PSTL) is connected to a signal line in a different layer (e.g., a respective power supply voltage line of the plurality of power supply voltage lines Vdd) in the second region.

Figure 12:
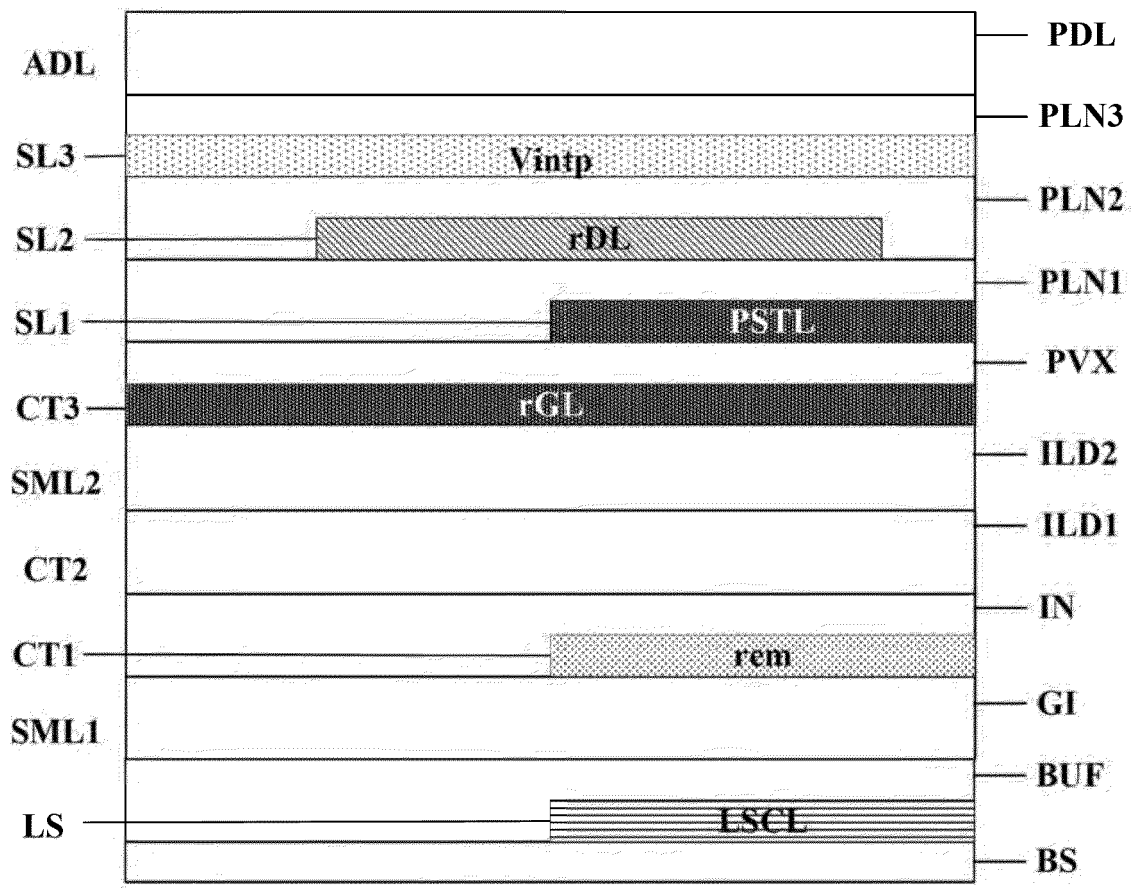
FIG. 12 is a cross-sectional view along an A-A' line in FIG. 5.

FIG. 12 is a cross-sectional view along an A-A' line in FIG. 5. Referring to FIG. 5, FIG. 9A to FIG. 9Q, and FIG. 12, in some embodiments, the array substrate includes a base substrate BS, a light shielding layer LS on the base substrate BS, a buffer layer BUF on a side of the light shielding layer LS away from the base substrate BS, a first semiconductor material layer SML1 on a side of the buffer layer BUF away from the base substrate BS, a gate insulating layer GI on a side of the first semiconductor material layer SML1 away from the base substrate BS, a first conductive layer CT1 on a side of the gate insulating layer GI away from the base substrate BS, an insulating layer IN on a side of the first conductive layer CT1 away from the base substrate BS, a second conductive layer CT2 on a side of the insulating layer IN away from the base substrate BS, a first inter-layer dielectric layer ILD1 on a side of the second conductive layer CT2 away from the base substrate BS, a second semiconductor material layer SML2 on a side of the first inter-layer dielectric layer ILD1 away from the base substrate BS, a second inter-layer dielectric layer ILD2 on a side of the second semiconductor material layer SML2 away from the base substrate BS, a third conductive layer CT3 on a side of the second inter-layer dielectric layer ILD2 away from the base substrate BS, a passivation layer PVX on a side of the third conductive layer CT3 away from the base substrate BS, a first signal line layer SL1 on a side of the passivation layer PVX away from the base substrate BS, a first planarization layer PLN1 on a side of the first signal line layer SL1 away from the base substrate BS, a second signal line layer SL2 on a side of the first planarization layer PLN1 away from the base substrate BS, a second planarization layer PLN2 on a side of the second signal line layer SL2 away from the base substrate BS, a third signal line layer SL3 on a side of the second planarization layer PLN2 away from the base substrate BS, a third planarization layer PLN3 on a side of the third signal line layer SL3 away from the base substrate BS, an anode layer ADL on a side of the third planarization layer PLN3 away from the base substrate BS, and a pixel definition layer PDL on a side of the anode layer ADL away from the base substrate BS.

Referring to FIG. 5 and FIG. 12, the light shielding block connecting line LSCL in the light shielding layer LS, the light emitting control signal line rem in the first conductive layer CT1, the gate line rGL in the third conductive layer CT3, and the power supply transmission line PSTL, in the first signal line SL1 extend at least partially through the first region DA1 along a first direction DR1. Orthographic projections of the light shielding block connecting line LSCL, the light emitting control signal line rem, the gate line rGL, and the power supply transmission line PSTL on a base substrate at least partially overlap with each other continuously over a length of at least two first subpixels along the first direction DR1. The light shielding block connecting line LSCL, the light emitting control signal line rem, the gate line rGL, and the power supply transmission line PSTL have conforming shapes and substantially parallel extension directions where the orthographic projections of the multiple signal lines overlap with each other continuously over the length of at least two first subpixels.

Referring to FIG. 5 and FIG. 12, at least a portion of the data line rDL and a portion of the gate line rGL have conforming shapes and substantially parallel extension directions. Orthographic projections of the portion of the data line rDL and the portion of the gate line rGL on a base substrate at least partially overlap with each other.

In another aspect, the present disclosure provides an array substrate having a unique signal line layout structure. In some embodiment, the array substrate includes a first region and a second region. In some embodiments, the array substrate includes a plurality of first signal lines extending along the first direction DR1. A respective first signal line extends continuously through the first region DA1 and the second region DA2. The respective first signal line extending continuously through the first region DA1 and the second region DA2 has different shapes in the first region DA1 and the second region DA2. The respective first signal line includes a first-first line portion in the first region DA1 and a second-first line portion in the second region DA2. In one example, the first-first line portion in the first region DA1 is a zig-zag line portion. In another example, the first-first line portion in the first region DA1 is a light shielding block connecting line LSCL.

In some embodiments, the array substrate includes a plurality of second signal lines extending along the first direction DR1. A respective second signal line extends continuously through the first region DA1 and the second region DA2. The respective second signal line extending continuously through the first region DA1 and the second region DA2 has different shapes in the first region DA1 and the second region DA2. The respective second signal line includes a first-second line portion in the first region DA1 and a second-second line portion in the second region DA2. In one example, the first-second line portion in the first region DA1 is a zig-zag line portion. In another example, the first-first line portion in the first region DA1 is a light emitting control signal line rem.

In some embodiments, the array substrate includes a plurality of third signal lines extending along the first direction DR1. A respective third signal line extends continuously through the first region DA1 and the second region DA2. The respective third signal line extending continuously through the first region DA1 and the second region DA2 has different shapes in the first region DA1 and the second region DA2. The respective third signal line includes a first-third line portion in the first region DA1 and a second-third line portion in the second region DA2. In one example, the first-third line portion in the first region DA1 is a zig-zag line portion. In another example, the first-third line portion in the first region DA1 is a gate line rGL.

In some embodiments, the array substrate includes a plurality of fourth signal lines extending along the first direction DR1. A respective fourth signal line extends at least partially through the first region DA1, and discontinues in the second region DA2. In one example, the respective fourth signal line extends at least partially through the first region DA1 is a zig-zag line. In another example, a respective fourth signal line of the plurality of fourth signal lines is a power supply transmission line PSTL.

In some embodiments, the array substrate includes a plurality of fifth signal lines extending along the second direction DR2. A respective fifth signal line extends continuously through the first region DA1 and the second region DA2. The respective fifth signal line extending continuously through the first region DA1 and the second region DA2 has different shapes in the first region DA1 and the second region DA2. The respective fifth signal line includes a first-fifth line portion in the first region DA1 and a second-fifth line portion in the second region DA2. In one example, the first-fifth line portion in the first region DA1 is a zig-zag line portion. In another example, the first-fifth line portion in the first region DA1 is a data line rDL.

In some embodiments, the array substrate includes a plurality of sixth signal lines extending along the second direction DR2. A respective sixth signal line extends at least partially through the second region DA1, and discontinues in the first region DA1. In one example, the plurality of sixth signal lines are a plurality of power supply voltage lines Vdd. Optionally, the respective fourth signal line of the plurality of fourth signal lines is coupled to a respective sixth signal line of the plurality of sixth signal lines.

In some embodiments, orthographic projections of the first-first line portion, the first-second line portion, the first-third line portion, and the respective fourth signal line of the plurality of fourth signal lines on a base substrate at least partially overlap with each other continuously over a length of at least two first subpixels along the first direction.

In some embodiments, the first-first line portion, the first-second line portion, the first-third line portion, and the respective fourth signal line of the plurality of fourth signal lines have conforming shapes and substantially parallel extension directions where the orthographic projections of the first-first line portion, the first-second line portion, the first-third line portion, and the respective fourth signal line of the plurality of fourth signal lines overlap with each other continuously over the length of at least two first subpixels.

In some embodiments, at least a portion of the first-fifth line portion and a portion of the first-first line portion have conforming shapes and substantially parallel extension directions. Orthographic projections of the portion of the first-fifth line portion and the portion of the first-first line portion on a base substrate at least partially overlap with each other.

In some embodiments, at least a portion of the first-fifth line portion and a portion of the first-second line portion have conforming shapes and substantially parallel extension directions. Orthographic projections of the portion of the first-fifth line portion and the portion of the first-second line portion on a base substrate at least partially overlap with each other.

In some embodiments, at least a portion of the first-fifth line portion and a portion of the first-third line portion have conforming shapes and substantially parallel extension directions. Orthographic projections of the portion of the first-fifth line portion and the portion of the first-third line portion on a base substrate at least partially overlap with each other.

In some embodiments, at least a portion of the first-fifth line portion and a portion of the respective fourth signal line of the plurality of fourth signal lines have conforming shapes and substantially parallel extension directions. Orthographic projections of the portion of the first-fifth line portion and the portion of the respective fourth signal line of the plurality of fourth signal lines on a base substrate at least partially overlap with each other.

In some embodiments, the plurality of first subpixels in the first region DA1 and the plurality of second subpixels in the second region DA2 are parts of a same array of subpixels arranged in rows and columns. A same row comprising first subpixels and second subpixels are provided with light emitting control signals using a same light emitting control signal line. A same column comprising first subpixels and second subpixels are provided with data signals using a same data line. A same row comprising first subpixels and second subpixels are provided with gate scanning signals using a same gate line. A same row comprising first subpixels and second subpixels are provided with power supply voltage signals using two different signal lines in two different layers, respectively. In a same row comprising first subpixels and second subpixels, the first subpixels in the same row are provided with reset signals using a unitary plate, and the second subpixels in the same row are provided with reset signals using a signal line. The unitary plate is absent in the second region. Optionally, the unitary plate and the reset signal line for the second region are in two different layers. Optionally, the unitary plate and a plurality of anode connecting pads in the first region are in a same layer.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present invention provides a method of fabricating an array substrate. In some embodiments, the method includes forming a plurality of first subpixels in a first region and forming a plurality of second subpixels in a second region. Optionally, forming the plurality of first subpixels includes forming a plurality of first pixel driving circuits; and forming the plurality of second subpixels includes forming a plurality of second pixel driving circuits. Optionally, a respective first pixel driving circuit of the plurality of first pixel driving circuits includes a smaller number of transistors than a respective second pixel driving circuit of the plurality of second pixel driving circuits. Optionally, the first region has a light transmittance higher than the second region, and a subpixel density same as the second region.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of first subpixels in a first region and a plurality of second subpixels in a second region;
   wherein the plurality of first subpixels comprise a plurality of first pixel driving circuits, the plurality of second subpixels comprise a plurality of second pixel driving circuits;
   a respective first pixel driving circuit of the plurality of first pixel driving circuits comprises a smaller number of transistors than a respective second pixel driving circuit of the plurality of second pixel driving circuits; and the first region has a light transmittance higher than the second region, and a subpixel density same as the second region;

wherein a respective data line extending continuously through the first region and the second region has different shapes in the first region and the second region; and an orthographic projection of the respective data line on a base substrate at least partially overlap with an orthographic projection of active layers of driving transistors in a column of pixel driving circuits on the base substrate.

2. The array substrate of claim 1, further comprising a plurality of photodiodes in the first region configured to capture an image, and a camera circuit coupled to the plurality of photodiodes.

3. The array substrate of claim 1, comprising multiple signal lines in different layers extending at least partially through the first region along a first direction;

wherein orthographic projections of the multiple signal lines on a base substrate at least partially overlap with each other continuously over a length of at least two first subpixels along the first direction.

4. The array substrate of claim 3, wherein the multiple signal lines have conforming shapes and substantially parallel extension directions where the orthographic projections of the multiple signal lines overlap with each other continuously over the length of at least two first subpixels; and at least one of the multiple signal lines extends, in a same layer, from the second region into the first region, and is configured to provide signals to multiple first subpixels in the first region and multiple second subpixels in the second region.

5. The array substrate of claim 4, wherein at least one of the multiple signal lines is configured to provide signals to multiple first subpixels in the first region but not to the plurality of second subpixels in the second region; and at least one of the multiple signal lines in the first region is connected to a signal line in a different layer in the second region.

6. The array substrate of claim 3, wherein the multiple signal lines comprise at least two of:

a light shielding block connecting line connecting a plurality of light shielding blocks in a light shielding layer;

a light emitting control signal line in a first conductive layer configured to provide a control signal to a gate electrode of an emission control transistor in the respective first pixel driving circuit;

a gate line in a third conductive layer configured to provide a control signal to a gate electrode of a data-write transistor in the respective first pixel driving circuit; and a power supply transmission line in a first signal line layer configured to provide a voltage to a second capacitor electrode of a storage capacitor in the respective first pixel driving circuit;

wherein orthographic projections of at least two of a portion of the light shielding block connecting line in the first region, a portion of the light emitting control signal line in the first region, a portion of the gate line in the first region, and a portion of the power supply transmission line in the first region on a base substrate at least partially overlap with each other.

7. The array substrate of claim 6, wherein a light shielding block connecting line is configured to transmit a same signal as a power supply transmission line.

8. The array substrate of claim 6, wherein, a portion of the light shielding block connecting line in the first region is a zig-zag line portion;

a portion of the light emitting control signal line in the first region is a zig-zag line portion;

a portion of the gate line in the first region is a zig-zag line portion; and a portion of the power supply transmission line in the first region is a zig-zag line portion.

9. The array substrate of claim 1, wherein, in the first region, along a first direction, an orthographic projection of an active layer of a reset transistor on a base substrate and an orthographic projection of an active layer of a data write transistor on the base substrate are on two opposite sides of an orthographic projection of an active layer of a driving transistor on the base substrate; and the active layer of the driving transistor is in a layer different from the active layer of the reset transistor and the active layer of the data write transistor.

10. The array substrate of claim 1, wherein the plurality of first subpixels comprise a plurality of first light emitting elements;

the plurality of second subpixels comprise a plurality of second light emitting elements; and for a first subpixel in the first region and a second subpixel in the second region configured to emit light of a same color, a first anode of a first light emitting element in the first subpixel has an area smaller than a second anode of a second light emitting element in the second subpixel.

11. The array substrate of claim 1, further comprising a pixel definition layer defining a plurality of first subpixel apertures in the first region and a plurality of second subpixel apertures in the second region;

wherein, for a first subpixel in the first region and a second subpixel in the second region configured to emit light of a same color, a first subpixel aperture of the first subpixel has an area smaller than a second subpixel aperture of the second subpixel.

12. The array substrate of claim 1, further comprising a plurality of data lines extending continuously through the first region and the second region;

a respective data line extending continuously through the first region and the second region has different shapes in the first region and the second region; and in the first region, the respective data line is a zig-zag line.

13. The array substrate of claim 12, wherein the respective data line extends along a second direction;

at least a portion of the respective data line and a portion of a signal line extending along a first direction have conforming shapes and substantially parallel extension directions; and orthographic projections of the portion of the respective data line and the portion of the signal line on a base substrate at least partially overlap with each other.

14. The array substrate of claim 1, wherein the at least one signal line is selected from the group consisting of:

a power supply voltage line configured to provide a voltage to a second capacitor electrode of a storage capacitor in the respective second pixel driving circuit; and a gate line configured to provide a control signal to a gate electrode of a data-write transistor in the respective second pixel driving circuit.

15. A display apparatus, comprising the array substrate of claim 1, and one or more integrated circuits connected to the array substrate.

16. An array substrate, comprising a plurality of first subpixels in a first region and a plurality of second subpixels in a second region;
- wherein the plurality of first subpixels comprise a plurality of first pixel driving circuits, the plurality of second subpixels comprise a plurality of second pixel driving circuits;
- a respective first pixel driving circuit of the plurality of first pixel driving circuits comprises a smaller number of transistors than a respective second pixel driving circuit of the plurality of second pixel driving circuits; and
- the first region has a light transmittance higher than the second region, and a subpixel density same as the second region;
- wherein the plurality of first subpixels comprise a plurality of first light emitting elements;
- electrodes of transistors and capacitor of the respective first pixel driving circuit are clustered in a same region as a respective anode of a respective first light emitting element of the plurality of first light emitting elements; and
- the same region has an area no more than 50% of an area of a respective first subpixel of the plurality of first subpixels.

17. An array substrate, comprising a plurality of first subpixels in a first region, a plurality of second subpixels in a second region, and a reset signal plate configured to provide a reset signal to the plurality of first pixel driving circuits;
- wherein the plurality of first subpixels comprise a plurality of first pixel driving circuits, the plurality of second subpixels comprise a plurality of second pixel driving circuits;
- a respective first pixel driving circuit of the plurality of first pixel driving circuits comprises a smaller number of transistors than a respective second pixel driving circuit of the plurality of second pixel driving circuits; and
- the first region has a light transmittance higher than the second region, and a subpixel density same as the second region.

18. The array substrate of claim 17, wherein the reset signal plate is a unitary plate.

19. The array substrate of claim 17, further comprising a plurality of anode connecting pads in the first region and a plurality of apertures extending through the reset signal plate;
- wherein the plurality of anode connecting pads are in the plurality of apertures, respectively;
- wherein the plurality of first subpixels comprise a plurality of first light emitting elements; and
- the plurality of anode connecting pads are coupled to a plurality of anodes of the plurality of first light emitting elements, respectively.

* * * * *